United States Patent
Choi et al.

(10) Patent No.: US 12,521,046 B2
(45) Date of Patent: Jan. 13, 2026

(54) DISPLAY DEVICE

(71) Applicant: SAMSUNG DISPLAY CO., LTD., Yongin-si (KR)

(72) Inventors: Myeong Il Choi, Yongin-si (KR); O Sung Seo, Yongin-si (KR); Sung Hyun Kim, Yongin-si (KR); Young Su Kim, Yongin-si (KR); Ki Ho Lim, Yongin-si (KR); Eui Ri Cho, Yongin-si (KR); Duk Woon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 332 days.

(21) Appl. No.: 18/101,443

(22) Filed: Jan. 25, 2023

(65) Prior Publication Data

US 2023/0320632 A1 Oct. 12, 2023

(30) Foreign Application Priority Data

Apr. 11, 2022 (KR) ........................ 10-2022-0044798

(51) Int. Cl.
*A61B 5/1455* (2006.01)
*A61B 5/00* (2006.01)
(Continued)

(52) U.S. Cl.
CPC ........ *A61B 5/14552* (2013.01); *A61B 5/0205* (2013.01); *A61B 5/7445* (2013.01); *H10K 39/34* (2023.02); *A61B 5/6898* (2013.01); *A61B 2562/0238* (2013.01); *H10K 59/12* (2023.02); *H10K 2102/311* (2023.02)

(58) Field of Classification Search
CPC . A61B 5/14552; A61B 5/0205; A61B 5/7445; A61B 5/6898; A61B 2562/0238; A61B 5/0059; A61B 5/021; A61B 5/02416; A61B 5/02438; A61B 5/14551;
(Continued)

(56) References Cited

U.S. PATENT DOCUMENTS

| | | | |
|---|---|---|---|
| 2008/0200785 A1* | 8/2008 | Fortin | A61B 5/0235 600/407 |
| 2019/0259351 A1* | 8/2019 | Yoon | G09G 3/035 |
| 2021/0089079 A1 | 3/2021 | Kang et al. | |

FOREIGN PATENT DOCUMENTS

| | | |
|---|---|---|
| KR | 10-2019-0100795 | 8/2019 |
| KR | 10-2020-0140985 | 12/2020 |
| KR | 10-2021-0033788 | 3/2021 |

* cited by examiner

*Primary Examiner* — Rex R Holmes
(74) *Attorney, Agent, or Firm* — F. CHAU & ASSOCIATES, LLC

(57) ABSTRACT

A display device comprising a display panel including a first non-folding area having a first emission area, a second non-folding area having a sensing area and a folding area that is disposed between the first non-folding area and the second non-folding area. A first light emitting diode is disposed in the first emission area and a second light emitting diode and a light receiving element are disposed in the sensing area. A processor obtains a biometric signal of a user by using the light receiving element and at least one of the first light emitting diode and the second light emitting diode. The processor generates biometric information based on the biometric signal. The processor detects the biometric signal when the display panel is folded so that the first non-folding area and the second non-folding areas are disposed to face each other.

20 Claims, 16 Drawing Sheets

(51) Int. Cl.
*A61B 5/0205* (2006.01)
*H10K 39/34* (2023.01)
*H10K 59/12* (2023.01)
*H10K 102/00* (2023.01)

(58) Field of Classification Search
CPC .. H10K 39/34; H10K 59/12; H10K 2102/311; H10K 59/65; H10K 59/35
See application file for complete search history.

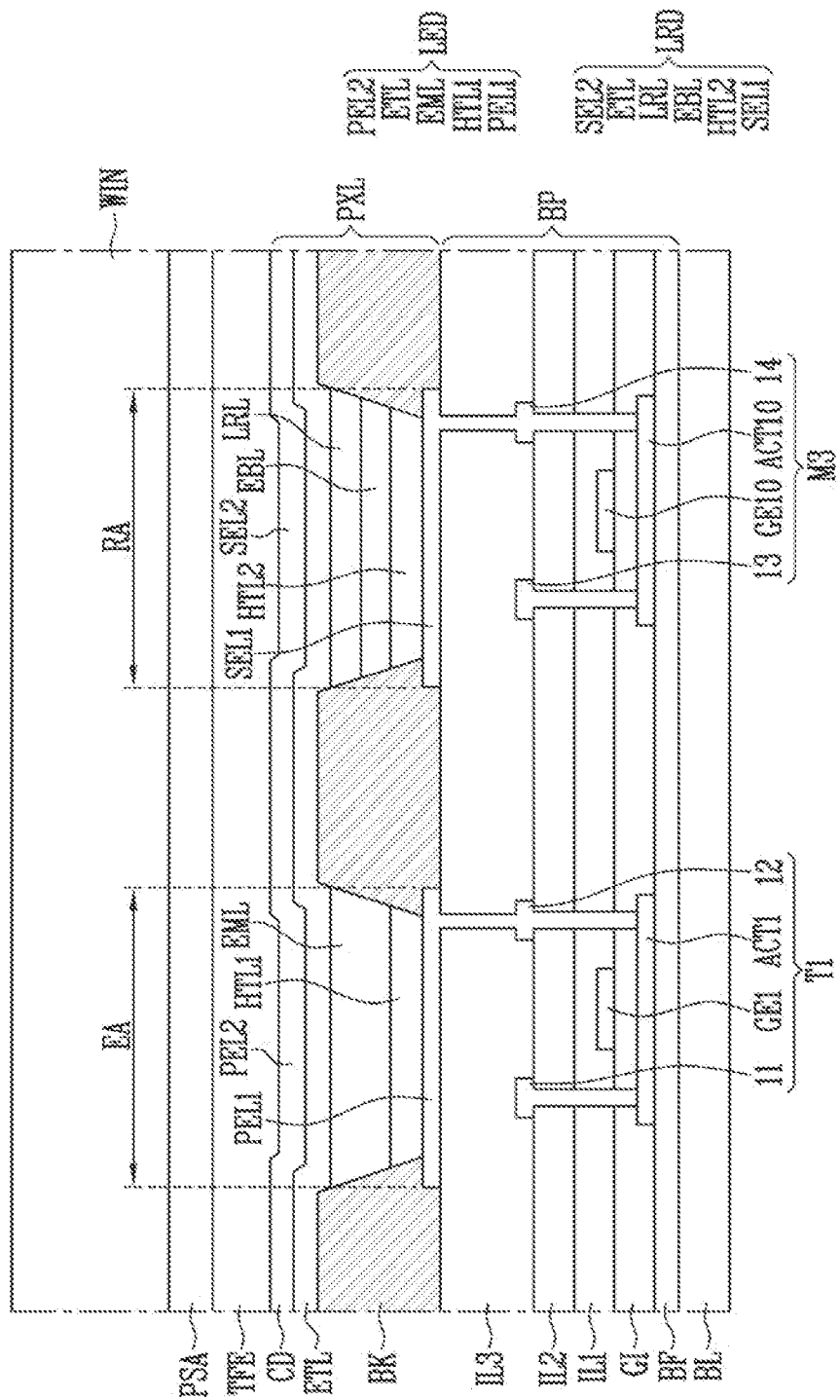

DISPLAY DEVICE

CROSS-REFERENCE TO RELATED APPLICATION

This application claims priority under 35 U.S.C. § 119 to Korean Patent Application No. 10-2022-0044798, filed on Apr. 11, 2022 in the Korean Intellectual Property Office, the disclosure of which is incorporated by reference in its entirety herein.

TECHNICAL FIELD

The present disclosure relates to a display device including an optical sensor.

DISCUSSION OF RELATED ART

As display devices are being applied to an increasing variety of electronic devices, the various functions and designs of the display devices have also increased. For example, to increase a display area, the display device may include a through hole in the display area, and may include a camera sensor in the through hole. In addition, in the display panel which occupies the largest area in the display device, the display device may include a fingerprint sensor for recognizing a fingerprint.

Recently, to increase the portability of the display device and provide a wider display screen, a bendable display device with a bendable display area or a foldable display device with a foldable display area has been developed.

When being folded, the foldable display device may have a configuration in which the folded display areas faces each other. Technologies for measuring a user's biometric information using such a configuration are being actively conducted.

SUMMARY OF THE INVENTION

Embodiments of the present disclosure have been made to provide a display device that can measure a user's biometric information.

However, the object of embodiments of the present disclosure are not necessarily limited to the above-described objects, and may be variously expanded without departing from the spirit and scope of the present disclosure.

According to an embodiment of the present disclosure, a display device comprises a display panel including a first non-folding area having a first emission area, a second non-folding area having a sensing area and a folding area that is disposed between the first non-folding area and the second non-folding area. A first light emitting diode is disposed in the first emission area and a second light emitting diode and a light receiving element are disposed in the sensing area. A processor obtains a biometric signal of a user by using the light receiving element and at least one of the first light emitting diode and the second light emitting diode. The processor generates biometric information based on the biometric signal.

In an embodiment, the processor detects the biometric signal when the display panel is folded so that the first non-folding area and the second non-folding areas are disposed to face each other.

In an embodiment, the processor may detect the biometric signal by using light from the first light emitting diode that passes through an object of the user that is disposed between the first light emitting diode and the light receiving element.

In an embodiment, the processor turns off the second light emitting diode when detecting the biometric signal.

In an embodiment, the biometric signal may be a photoplethysmogram (PPG) signal, and the biometric information may include oxygen saturation, pulse, and blood pressure of the user.

In an embodiment, the first light emitting diode and the second light emitting diode may include a first emission layer that emits light with a first wavelength range of about 600 to about 680 nm.

In an embodiment, the first light emitting diode and the second light emitting diode may further include a second emission layer that emits light with a second wavelength range of about 850 to about 1000 nm.

In an embodiment, the light receiving element includes a light receiving layer that detects intensity of light by emitting electrons in response to the light with the first and second wavelength ranges, and the light receiving layer may be disposed on a same pixel circuit layer as the first emission layer.

In an embodiment, the processor may detect the biometric signal by using light from the second light emitting diode that is reflected by an object of the user that is disposed on the second light emitting diode and the light receiving element.

In an embodiment, the processor turns off the first light emitting diode when detecting the biometric signal.

In an embodiment, an intensity of light emitted from the first light emitting diode may be greater than an intensity of light emitted from the second light emitting diode.

According to an embodiment of the present disclosure, a display device comprises a display panel including a first non-folding area having a panel hole and a peripheral area of the panel hole, a second non-folding area having an emission area, and a folding area disposed between the first non-folding area and the second non-folding area. A component is disposed in the panel hole. A first light emitting diode is disposed in the peripheral area of the panel hole. A second light emitting diode is disposed in the emission area. A processor obtains a biometric signal of a user by using the component and at least one of the first light emitting diode and the second light emitting diode. The processor generates biometric information based on the biometric signal.

In an embodiment, the processor detects the biometric signal when the display panel is folded so that the first non-folding area and the second non-folding area are disposed to face each other.

In an embodiment, the processor may detect the biometric signal by using light from the second light emitting diode passing through an object of the user that is disposed between the second light emitting diode and the component.

In an embodiment, the processor turns off the first light emitting diode when detecting the biometric signal.

In an embodiment, the biometric signal may be a photoplethysmogram (PPG) signal, and the biometric information may include oxygen saturation, pulse, and blood pressure of the user.

In an embodiment, the first light emitting diode and the second light emitting diode may include a first emission layer that emits light with a first wavelength range of about 600 to about 680 nm.

In an embodiment, the first light emitting diode and the second light emitting diode may further include a second emission layer that emits light with a second wavelength range of about 850 to about 1000 nm.

In an embodiment, the component may include a camera image sensor and an infrared sensor.

In an embodiment, the processor may detect the biometric signal by using light from the first light emitting diode that is reflected by an object of the user that is disposed on the first light emitting diode and the component.

In an embodiment, the processor turns off the second light emitting diode when detecting the biometric signal.

In an embodiment, an intensity of light emitted from the second light emitting diode may be greater than an intensity of light emitted from the first light emitting diode.

The display device according to an embodiment of the present disclosure may detect biometric information of a user by disposing the light emitting diode in one region of the display area and the light receiving element or the component in the other region of the display area. The one region and the other region may face each other when it is folded.

However, the effects of embodiments of the present disclosure are not necessarily limited to the above-described effects, and may be variously expanded without departing from the spirit and scope of the present disclosure.

BRIEF DESCRIPTION OF THE DRAWINGS

FIGS. 6A and 6B are cross-sectional views of a sensing area in FIG. 4 according to embodiments of the present disclosure.

DETAILED DESCRIPTION OF EMBODIMENTS

Figure 1:
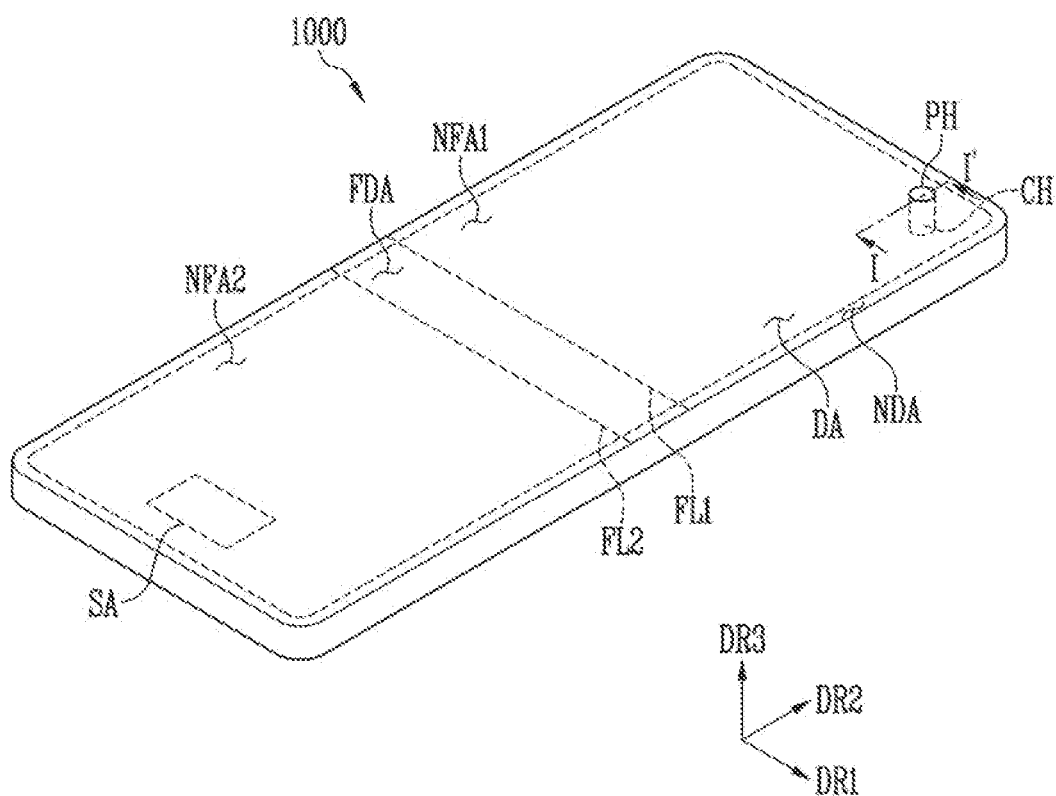
FIG. 1 is a perspective view of a front surface of a foldable display device in an unfolded state according to an embodiment of the present disclosure.

The advantages and features of the present disclosure and the methods for accomplishing the same will be apparent from non-limiting embodiments described hereinafter with reference to the accompanying drawings. However, the present disclosure is not limited to embodiments described herein, and may be embodied in many different forms. The following embodiments are provided to allow those skilled in the art to clearly understand the scope of the present disclosure.

It will be understood that when an element or a layer is referred to as being "on" another element or another layer, it can be directly on the other element or another layer or intervening elements or layers may also be present. When an element or a layer is referred to as being "directly on" another element or another layer no intervening elements or layers may be present. Like reference numerals designate like elements throughout the specification. The shapes, sizes, proportions, angles, numbers, etc. disclosed in the drawings for explaining the embodiments are for convenience of explanation and certain features may be exaggerated or simplified, and thus embodiments of the present disclosure are not necessarily limited to the illustrated matters.

Embodiments of the present disclosure will now be described in detail with reference to the accompanying drawings.

Figure 2:
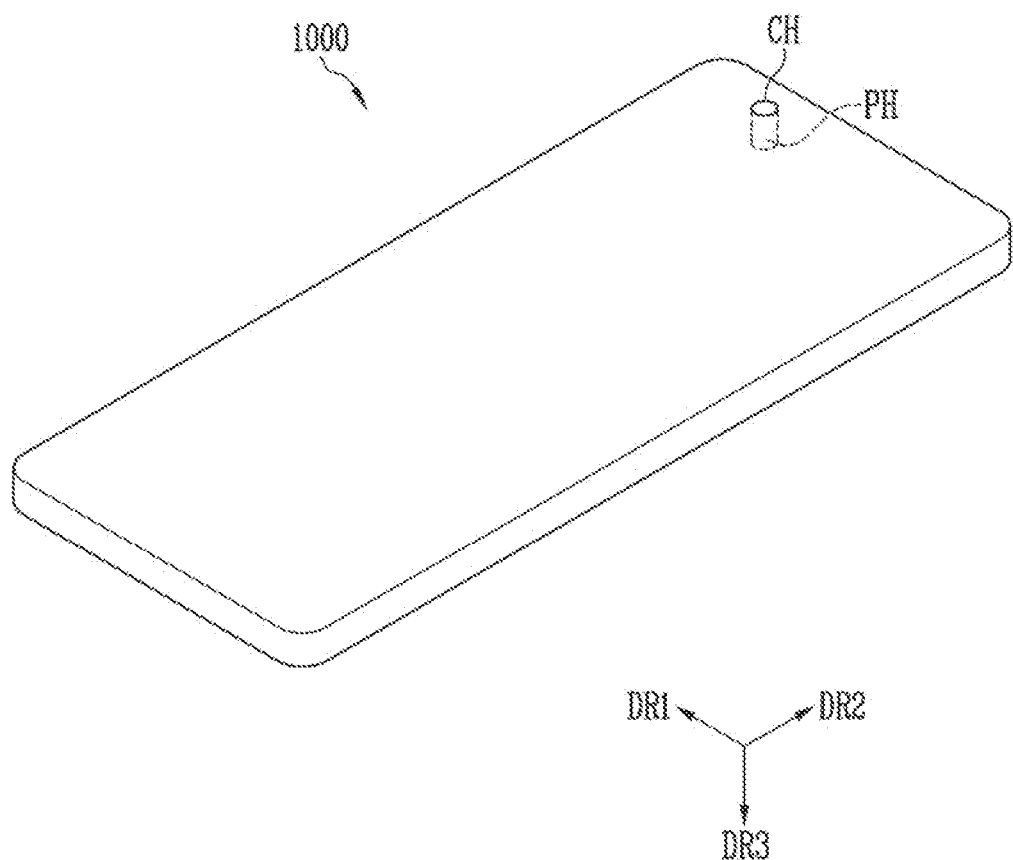
FIG. 2 is a perspective view of a rear surface of a foldable display device in an unfolded state according to an embodiment of the present disclosure.
Figure 3:
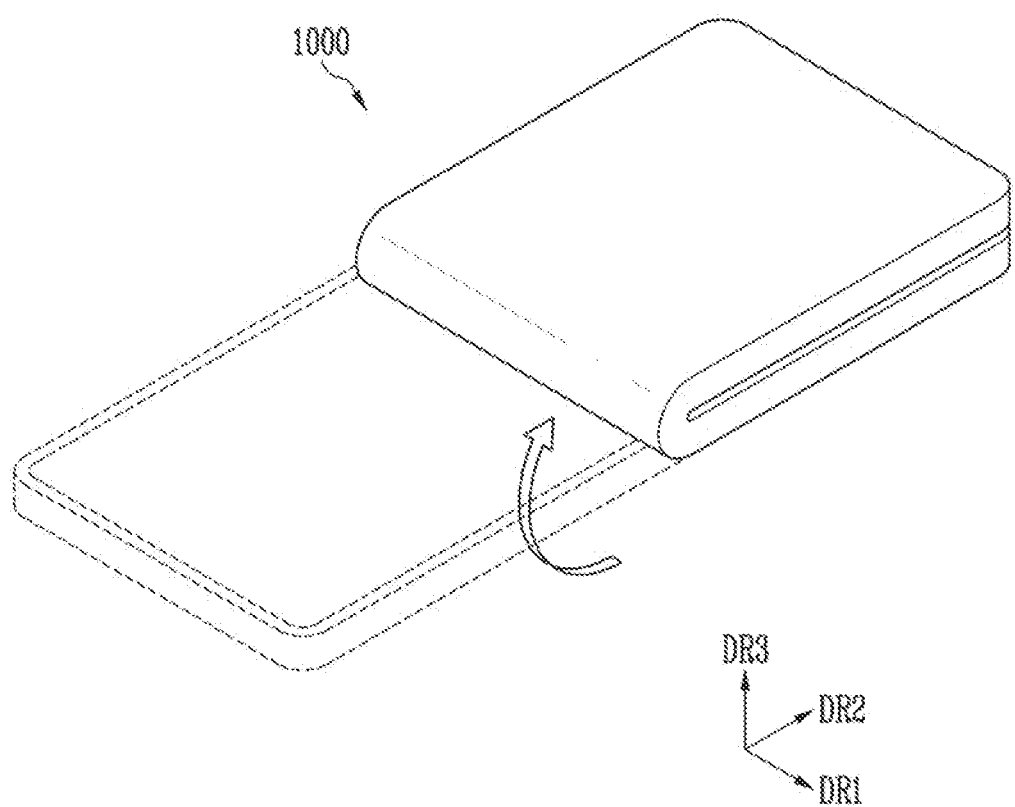
FIG. 3 is a perspective view of a foldable display device in a folded state according to an embodiment of the present disclosure.

FIG. 1 is a perspective view of a front surface of a foldable display device according to an embodiment in an unfolded state. FIG. 2 is a perspective view of a rear surface of a foldable display device according to an embodiment in an unfolded state. FIG. 3 is a perspective view of a foldable display device according to an embodiment in a folded state.

Referring to FIG. 1, a foldable display device 1000 according to an embodiment has been mainly described such that it is applied to a smartphone, but embodiments of the present invention are not necessarily limited thereto. For example, the foldable display device 1000 according to embodiments of the present disclosure can be applied to a mobile phone, a tablet PC, a personal digital assistant (PDA), a portable multimedia player (PMP), a television, a game console, and a wrist watch type electronic device, a head-mounted display, a monitor of a personal computer, a notebook computer, a car navigation system, a car dashboard, a digital camera, a camcorder, an external billboard, an electronic display, a medical device, an inspection device, a home appliance such as a refrigerator and a washing machine, or an Internet of Things (IoT) device. However, embodiments of the present disclosure are not necessarily limited thereto and the foldable display device 100 may be applied to various different electronic devices. Embodiments will now be described in detail with reference to the accompanying drawings.

In addition, the foldable display device 1000 according to embodiments may be classified in various ways according to display schemes. For example, the display device may be classified into and include an organic light emitting diode (OLED) display, an inorganic light emitting diode (inorganic LED) display, a quantum dot light emitting display (QED), a micro LED display (micro-LED), and a nano LED display (nano-LED), a field emission display (FED), and an electrophoretic display (EPD). In the following description, the organic light emitting diode display will be described as an example of the display device, and unless a specific distinction is required, the organic light emitting display applied to an embodiment will be simply referred to as a display device. However, embodiments of the present disclosure are not necessarily limited to the organic light emitting diode display, and other displays listed above or known in the art may be applied.

In FIGS. 1 to 3, when viewed on a plane, a first direction DR1 may be a direction parallel to one side of the foldable display device 1000, for example, a horizontal direction of the foldable display device 1000. When viewed on the plane, a second direction DR2 may be a direction parallel to the other side in direct contact with one side of the foldable display device 1000, such as a vertical direction of the foldable display device 1000. A third direction DR3 may be a thickness direction of the foldable display device 1000. For example, in an embodiment the third direction DR3 may be orthogonal to the first and second directions DR1, DR2. However, embodiments of the present disclosure are not necessarily limited thereto.

In an embodiment, when viewed on the plane, the foldable display device 1000 may have a rectangular or a square shape. When viewed on the plane, the foldable display device 1000 may have a rectangular shape with vertical corners or a rectangular shape with rounded corners. When viewed on the plane, the foldable display device 1000 may include two relatively short sides that extend in the first direction DR1, and two relatively long sides that extend in the second direction DR2.

The foldable display device 1000 may include a display area DA and a non-display area NDA. In an embodiment, when viewed on the plane, the shape of the display area DA may correspond to the shape of the foldable display device 1000. For example, if the foldable display device 1000 has a rectangular shape when viewed on the plane, the display area DA may also have a rectangular shape.

The display area DA may be an area that includes a plurality of pixels and thus displays an image. The plurality of pixels may be arranged in a matrix direction. In an embodiment, the plurality of pixels may be a rectangle, a rhombus, or a square when viewed on the plane. However, embodiments of the present disclosure are not necessarily limited thereto. For example, the plurality of pixels may be a rectangle, a rhombus, or a quadrangle other than a square, a polygon other than a quadrangle, a circle, or an ellipse when viewed on the plane.

Figure 4:
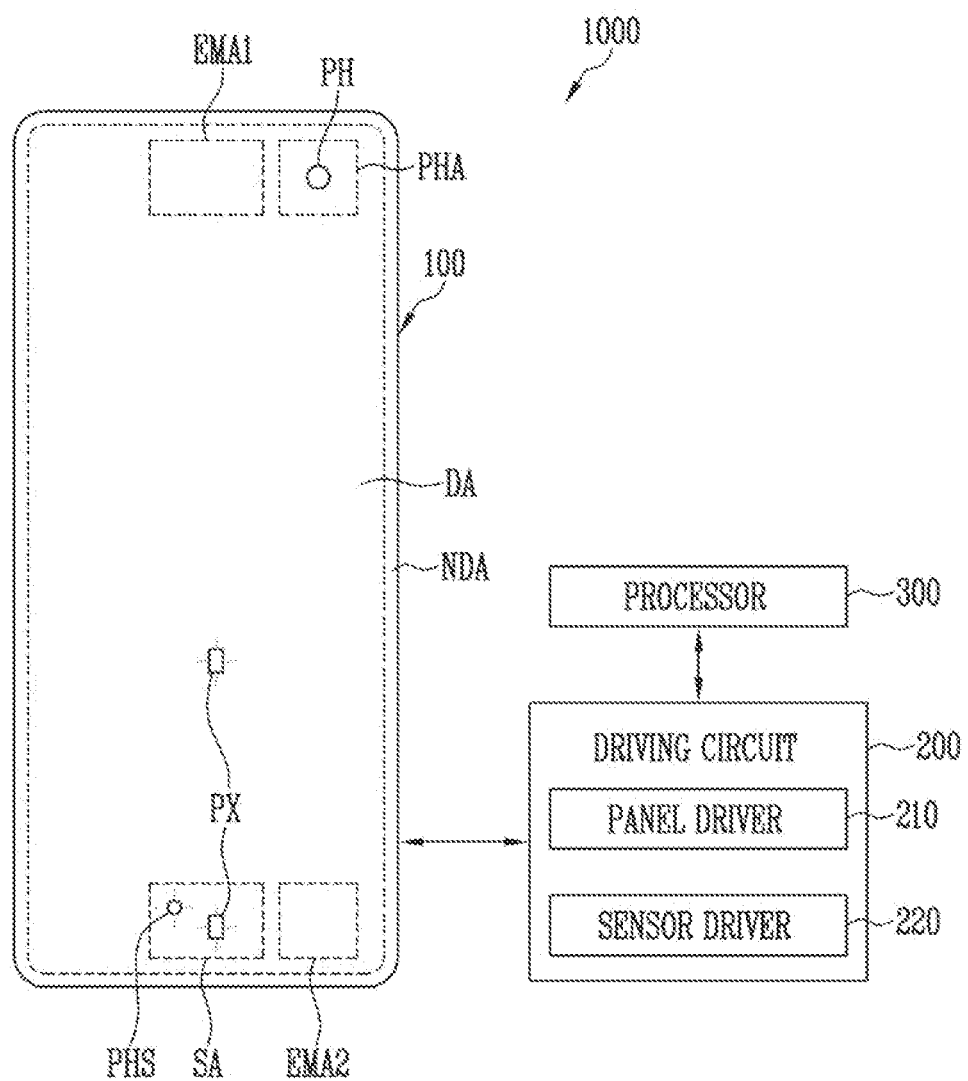
FIG. 4 is a block diagram for explaining an operation of a display device according to an embodiment of the present disclosure.

In an embodiment, the display area DA may include an optical sensor (PHS in FIG. 4). The optical sensor may include a light receiving element that includes a light receiving layer. In the display area DA, the light receiving layer of the light receiving element may be disposed to be spaced apart from an emission layer of the light emitting diode.

In an embodiment shown in FIG. 1, only a portion of the display area DA is set to a predetermined sensing area SA, and optical sensors may be provided in the corresponding sensing area SA. However, this is only an example and embodiments of the present disclosure are not necessarily limited thereto. For example, in an embodiment the plurality of optical sensors may also be spaced apart from each other and distributed over the entire display area DA. In addition, the optical sensor may also be included at least in some of the non-display area NDA.

The non-display area NDA may be an area that does not display an image because it does not include pixels. The non-display area NDA may be disposed around the display area. DA. For example, in an embodiment the non-display area NDA may be disposed to surround the display area DA (e.g., completely surround the display area DA in the first and second directions DR1, DR2) as shown in FIGS. 1 and 3. However, embodiments of the present disclosure are not necessarily limited thereto. For example, in an embodiment the display area DA may be partially surrounded by the non-display area NDA.

The foldable display device 1000 may include at least one panel hole PH on the front surface. The panel hole PH may be disposed in the display area DA. The panel hole PH may be disposed to be surrounded by the display area DA (e.g., completely surround the display area DA in the first and second directions DR1, DR2) as shown in FIGS. 1 and 3. However, embodiments of the present disclosure are not necessarily limited thereto. For example, in an embodiment the panel hole PH may be partially surrounded by the display area DA. In this embodiment, a portion of the panel hole PH may be surrounded by the display area DA, and the remaining portion of the panel hole PH may be surrounded by the non-display area NDA.

As shown in FIGS. 1 and 2, the foldable display device 1000 may include a cover hole CH that is disposed on a rear surface. The cover hole CH may be disposed on the rear surface of the foldable display device 1000, and may overlap the display area DA (e.g., in the third direction DR3). In an embodiment, the cover hole CH is not visible on the front surface of the foldable display device 1000, and is visible on the rear surface. The cover hole CH is disposed to overlap the panel hole PH, such that these holes are continuously connected. For example, the panel hole PH and the cover hole CH may be connected.

A component (CP in FIG. 9) may be disposed in the panel hole PH and the cover hole CH. For example, in an embodiment the component may be a sensor that senses light, such as an infrared sensor and a camera image sensor. In this embodiment, the camera image sensor may be a CMOS sensor.

In an embodiment, the panel hole PH and the cover hole CH1 may have a circular shape when viewed on the plane as shown in FIGS. 1 to 3, but embodiments of the present invention are not necessarily limited thereto. For example, in an embodiment the panel hole PH and the cover hole CH may have a quadrangular shape.

In FIGS. 1 to 3, the foldable display device 1000 includes one panel hole PH and one cover hole CH, but embodiments of the present disclosure are not necessarily limited thereto. For example, in an embodiment the foldable display device 1000 may include a plurality of panel holes PH and a plurality of cover holes. An illuminance sensor and a proximity sensor may be mounted in the plurality of cover holes.

The foldable display device 1000 may maintain both a folded state and an unfolded state. In an embodiment, the foldable display device 1000 may be folded in an in-folding manner in which the display area DA is disposed inside as shown in FIG. 3. When the foldable display device 1000 is folded in the in-folding manner, the display area DA of the foldable display device 1000 may be disposed to face each other.

Referring to embodiments shown in FIGS. 1 and 3, the foldable display device 1000 may include a folding area FDA, a first non-folding area NFA1, and a second non-folding area NFA2. The folding area FDA may be an area in which the foldable display device 1000 is folded, and the first non-folding area NFA1 and the second non-folding area NFA2 may be areas in which the foldable display device 1000 is not folded. However, embodiments of the present disclosure are not necessarily limited thereto and the number of the folding areas and non-folding areas and the arrangements thereof may vary.

The first non-folding area NFA1 may be disposed at one side of the folding area FDA, for example, at an upper side of the folding area FDA (e.g., in the second direction DR2). The second non-folding area NFA2 may be disposed at the other side of the folding area FDA, for example, at a lower side of the folding area FDA (e.g., in the second direction DR2). The folding area FDA may be an area that is bent at a predetermined curvature in a first folding line FL1 and a second folding line FL2. Therefore, the first folding line FL1 may be a boundary between the folding area FDA and the first non-folding area NFA1, and the second folding line FL2 may be a boundary between the folding area FDA and the second non-folding area NFA2.

The first folding line FL1 and the second folding line FL2 may extend in the first direction DR1 as shown in FIGS. 1 and 3, and the foldable display device 1000 may be folded in the second direction DR2. Accordingly, since the length of the foldable display device 1000 in the second direction DR2 may be reduced by about half, the foldable display device 1000 may provide increased user convenience and portability for carrying the foldable display device 1000.

In an embodiment, an extending direction of the first folding line FL1 and an extending direction of the second folding line FL2 are not necessarily limited to the first direction DR1. For example, in an embodiment the first folding line FL1 and the second folding line FL2 may extend in the second direction DR2, and the foldable display device 1000 may be folded in the first direction DR1. In this embodiment, the length of the foldable display device 1000 in the first direction DR1 may be reduced by about half. Alternatively, the first folding line FL1 and the second folding line FL2 may extend in a diagonal direction of the foldable display device 1000, such as a direction between the first and second directions DR1 and DR2. In this embodiment, the foldable display device 1000 may be folded in a triangular shape.

FIGS. 1 and 3, each of the display area DA and the non-display area NDA overlap the folding area FDA, the first non-folding area NFA1, and the second non-folding area NFA2, but embodiments of the present disclosure are not necessarily limited thereto. For example, in an embodiment each of the display area DA and the non-display area NDA may overlap at least one of the folding area FDA, the first non-folding area NFA1, and the second non-folding area NFA2.

FIG. 4 is a block diagram for explaining an operation of a display device according to an embodiment.

Referring to an embodiment shown in FIG. 4, the display device 1000 may include a display panel 100, a driving circuit 200, and a processor 300. In an embodiment, the driving circuit 200 may include a panel driver 210 and a sensor driver 220.

The display panel 100 may include a display area DA and a non-display area NDA. The display area DA may be an area in which a plurality of pixels PX are disposed. Each of the pixels PX may include at least one light emitting diode. For example, the light emitting diode may include an emission layer (e.g., an organic emission layer). A portion emitted by the light emitting diode may be defined as the emission area. The foldable display device 1000 may display an image in the display area DA by driving the pixels PX in response to image data received from the outside (e.g., an external source).

In an embodiment, only some of the display area DA may be set to be a predetermined sensing area SA, and optical sensors PHS may be provided in the corresponding sensing area SA. However, embodiments of the present disclosure are not necessarily limited thereto. For example, in an embodiment the plurality of optical sensors PHS may be distributed to be spaced apart from each other across the entire display area DA. In addition, in some embodiments the optical sensor PHS may be included in at least a portion of the non-display area NDA.

In an embodiment, when the foldable display device 1000 is in a folded state as shown in FIG. 3, light emitted from a light source disposed in a first emission area EMA1 may pass through a subject (e.g., a user's finger) such that it is detected by the optical sensors PHS. In addition, the optical sensors PHS may also detect that the light emitted from the light source disposed in the sensing area SA is reflected by the subject.

For example, the optical sensor PHS may detect various biometric information such as the user's oxygen saturation, pulse, and blood pressure. In addition, the optical sensor PHS may also detect external light, and may also perform the functions of a gesture sensor, a motion sensor, a proximity sensor, an illuminance sensor, and an image sensor. However, embodiments of the present disclosure are not necessarily limited thereto and the biometric information and functions detected by the optical sensor PHS may vary.

In an embodiment, the driving circuit 200 may include a panel driver 210 and a sensor driver 220. Although the panel driver 210 and the sensor driver 220 are separated from each other in FIG. 4, embodiments of the present disclosure are not necessarily limited thereto. For example, at least some of the sensor driver 220 may be included in the panel driver 210, or may operate together with the panel driver 210.

The panel driver 210 may scan the pixels PX of the display area DA, and may provide a data signal corresponding to image data (e.g., an image) to the pixels PX. The display panel 100 may display an image that corresponds to the data signal.

In an embodiment, the panel driver 210 may provide a driving signal for sensing biometric information to the pixels PX. The driving signal may be supplied to allow the pixels PX to operate as a light source for the optical sensor PHS by emitting light. In an embodiment, the panel driver 210 may provide the driving signals for sensing oxygen saturation, pulse, and blood pressure to the optical sensor PHS. However, embodiments of the present disclosure are not necessarily limited thereto. For example, in an embodiment the driving signals for sensing oxygen saturation, pulse, and blood pressure may be provided by the sensor driver 220.

The sensor driver 220 may detect biometric information such as the user's oxygen saturation, pulse, and blood pressure based on the sensing signal that is received from the optical sensors PHS. In the embodiment, the sensor driver 220 may also provide the driving signals to the optical sensor PHS and/or the pixel PX.

When a command for detecting the biometric information is received from the user, the processor 300 may control the driving circuit 200 to detect the biometric signal, and may generate the biometric information by using the detected biometric signal. Embodiments thereof will be described below in detail with reference to FIGS. 7 to 11.

Figure 5:
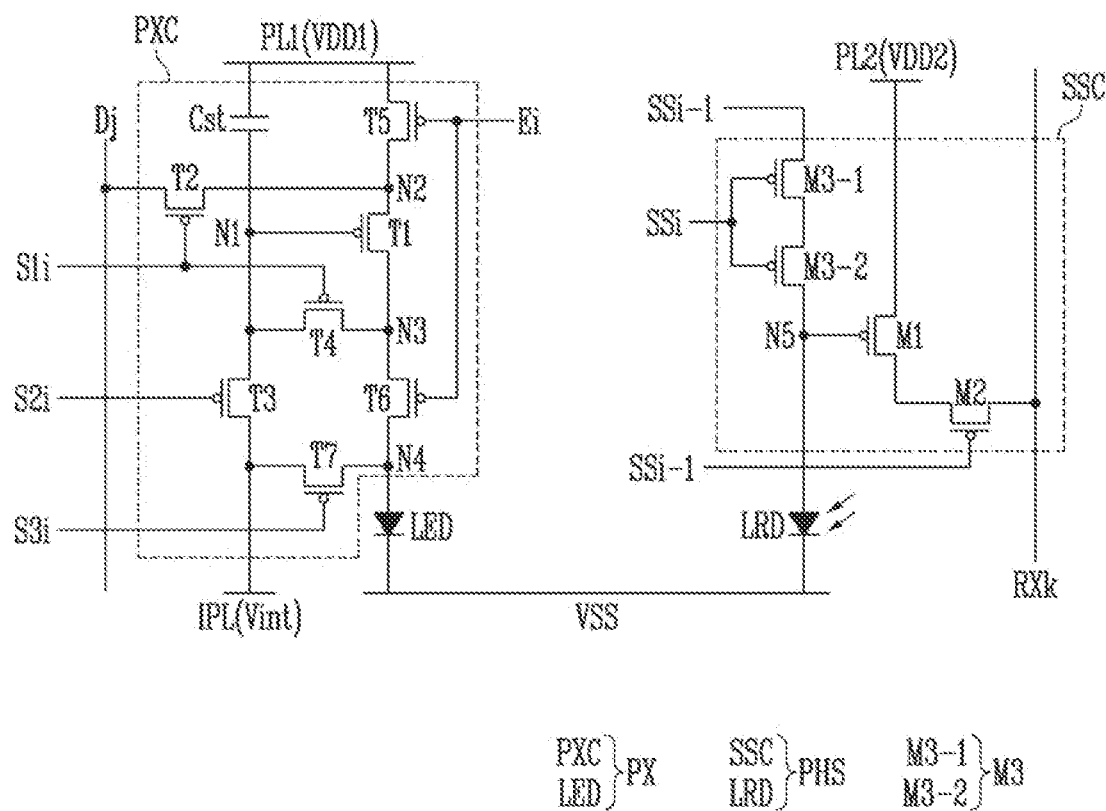
FIG. 5 is a circuit diagram of a pixel and an optical sensor that are included in the display device in FIG. 4 according to an embodiment of the present disclosure.

FIG. 5 is a circuit diagram of an embodiment of a pixel and an optical sensor included in the display device in FIG. 4.

In FIG. 5, for ease of description, a pixel PX is positioned in an i-th pixel row (e.g., an i-th horizontal line and is connected to a j-th data line Dj, and an optical sensor PHS is positioned in the i-th pixel row and is connected to a k-th readout line RXk (i, j, and k are natural numbers).

Referring to FIGS. 4 and 5, the pixel PX may include a pixel circuit PXC and a light emitting diode (LED) connected thereto, the optical sensor PHS may include a sensor circuit SSC and a light receiving element LRD connected thereto.

A first electrode (e.g., a first pixel electrode) of the light emitting diode (LED) may be connected to a fourth node N4, and a second electrode (e.g., second pixel electrode) thereof may be connected to a second power supply VSS. The light emitting diode (LED) may generate light with a predetermined luminance in response to an amount of current (e.g., a driving current) that is supplied from a first pixel transistor T1.

In an embodiment, the light emitting diode (LED) may be an organic light emitting diode that includes an organic emission layer. However, embodiments of the present disclosure are not necessarily limited thereto. For example, in an embodiment, the light emitting diode (LED) may be an inorganic light emitting diode that is formed of an inorganic material. In yet another embodiment, the light emitting diode (LED) may be a light emitting diode that is formed of both an inorganic material and an organic material.

A first electrode (e.g., a first sensor electrode) of the light receiving element LRD may be connected to a fifth node N5, and a second electrode (e.g., a second sensor electrode) thereof may be connected to a second power supply VSS. The light receiving element LRD may generate carriers including free electrons and holes based on the intensity of light incident on a light receiving layer, and may generate a current (a photocurrent) by movement of the carriers.

The pixel circuit PXC may include a first pixel transistor T1, a second pixel transistor T2, a storage capacitor Cst, and a light emitting diode (LED). In an embodiment, the pixel circuit PXC may further include third to seventh pixel transistors T3 to T7. However, embodiments of the present disclosure are not necessarily limited thereto.

The first pixel transistor T1 (e.g., the driving transistor) may be connected between the first electrode of the light emitting diode (LED) and a driving power line PL1 to which a voltage of a driving power supply VDD1 (e.g., a first power supply) is applied. The first pixel transistor T1 may include a gate electrode that is connected to a first node N1.

The first pixel transistor T1 may control, based on a voltage of the first node, an amount of current (e.g., a driving current) that flows from the driving power supply VDD1 to the second power supply VSS via the light emitting diode (LED). In an embodiment, the driving power supply VDD1 may be set to a higher voltage than the second power supply VSS.

The second pixel transistor T2 may be connected between a j-th data line Dj (hereinafter referred to as a data line) and a second node N2. A gate electrode of the second pixel transistor T2 may be connected to an i-th first scan line S1$i$ (hereinafter referred to as a first scan line). The second pixel transistor T2 may be turned on to electrically connect the data line Dj and the second node N2 when the first scan signal is supplied to the first scan line S1$i$.

A third pixel transistor T3 may be connected between the first node N1 and an initialization power line IPL that transmits a voltage of an initialization power supply Vint. A gate electrode of the third pixel transistor T3 may be connected to an i-th second scan line S2$i$ (hereinafter referred to as a second scan line). The third pixel transistor T3 may be turned on by a second scan signal that is supplied to the second scan line S2$i$. If the third pixel transistor T3 is turned on, the voltage of initialization power supply Vint may be supplied to the first node N1 (e.g., the gate electrode of the first pixel transistor T1). In an embodiment, the timing of the second scan signal supplied to the second scan line S2$i$ may be the same as the timing of the scan signal that is supplied to an (i−1)th first scan line (for example, referred to as S1$i$−1).

A fourth pixel transistor T4 may be connected between the first node N1 and a third node N3. A gate electrode of the fourth pixel transistor T4 may be connected to the first scan line S1$i$. The fourth pixel transistor T4 and the second pixel transistor T2 may be simultaneously turned on.

The fifth pixel transistor T5 may be connected between the driving power line PL1 and the second node N2. A gate electrode of the fifth pixel transistor T5 may be connected to an i-th emission control line Ei (hereinafter referred to as an emission control line). A sixth pixel transistor T6 may be connected between the third node N3 and the light emitting diode (LED) (e.g., the fourth node N4). A gate electrode of the sixth pixel transistor T6 may be connected to the emission control line Ei. The fifth pixel transistor T5 and the sixth pixel transistor T6 may be turned off when a light emission control signal is supplied to the emission control line Ei, and may be turned on when the light emission control signal is not supplied to the emission control line Ei.

In some embodiments, when the fifth and sixth pixel transistors T5 and T6 are turned on, a current flowing through the first pixel transistor T1 is transmitted to the light emitting diode (LED), and the light emitting diode (LED) may emit light.

A seventh pixel transistor T7 may be connected between the first electrode of the light emitting diode (LED) (e.g., the fourth node N4) and the initialization power line IPL. A gate electrode of the seventh pixel transistor T7 may be connected to an i-th third scan line S3$i$ (hereinafter referred to as a third scan line). The seventh pixel transistor T7 may be turned on by a third scan signal that is supplied to the third scan line S3$i$, thereby supplying the voltage of the initialization power supply Vint to the first electrode of the light emitting diode (LED). In an embodiment, the timing of the third scan signal supplied to the third scan line S3$i$ may be the same as the timing of one of the scan signals that are supplied to the first scan line S1$i$, the (i−1)th first scan line (S1$i$−1), and an (i+1)th first scan line (e.g., S1$i$+1).

The storage capacitor Cst may be connected between the driving power line PL1 and the first node N1.

In an embodiment, the first scan signal may be supplied after the second scan signal is supplied. For example, the second scan signal and the first scan signal may be supplied by a difference of one horizontal period. However, embodiments of the present disclosure are not necessarily limited thereto.

In an embodiment, the third scan signal and the first scan signal may be simultaneously supplied. However, embodiments of the present disclosure are not necessarily limited thereto. For example, in an embodiment the first scan signal may be supplied after the third scan signal is supplied. For example, the third scan signal and the first scan signal may be supplied at an interval of one horizontal period. Alternatively, the third scan signal may also be provided after the first scan signal is supplied.

The sensor circuit SSC may include a first sensor transistor M1, a second sensor transistor M2, and a third sensor transistor M3.

The first sensor transistor M1 and the second sensor transistor M2 may be connected in series between a sensing power line PL2 and a k-th readout line RXk (hereinafter referred to as a readout line). A sensing power supply VDD2 may be supplied to the sensing power line PL2. For example, a voltage of the sensing power supply VDD2 may be different from that of the driving power supply VDD1. However, embodiments of the present disclosure are not necessarily limited thereto. For example, in an embodiment the voltages of the sensing power supply VDD2 and the driving power supply VDD1 may also be the same.

A gate electrode of the first sensor transistor M1 may be connected to a first electrode (e.g., a first sensor electrode) of the fifth node N5 (e.g., the light receiving element LRD). The first sensor transistor M1 may generate, based on a voltage of the fifth node N5 according to a photocurrent generated by the light receiving element LRD, a sensing current that flows from the sensing power line PL2 to the readout line RXk.

In an embodiment, a gate electrode of the second sensor transistor M2 may be connected to an (i−1)th sensing scan line SSi−1 (hereinafter referred to as a previous sensing scan line). The second sensor transistor M2 may be turned on when a sensing scan signal is supplied to the previous sensing scan line SSi−1, and may electrically connect the first sensor transistor M1 and the readout line RXk. In an embodiment, the sensing signal (e.g., the sensing current) may subsequently be supplied to the sensor driver 220 through the readout line RXk.

The third sensor transistor M3 may be connected between the previous sensing scan line SSi−1 and the fifth node N5. A gate electrode of the third sensor transistor M3 may be connected to an i-th sensing scan line SSi (hereinafter referred to as a sensing scan line). The third sensor transistor M3 may be turned on by the sensing scan signal that is supplied to the i-th sensing scan line SSi, and may supply the voltage provided to the previous sensing scan line SSi−1 to the fifth node N5. The third sensor transistor M3 may be used to reset (e.g., initialize) the voltage of the fifth node N5.

In an embodiment as shown in FIG. 5, the third sensor transistor M3 may include a plurality of sub-transistors M3-1 and M3-2 that are connected in series.

In an embodiment, the timing of the sensing scan signal supplied to the sensing scan line SSi may be different from the timing of the scan signals supplied to the first to third scan lines S1i, S2i, and S3i. However, embodiments of the present disclosure are not necessarily limited thereto, and the sensing scan signal supplied to the sensing scan line SSi may be supplied at the same time as one of the scan signals supplied to the first to third scan lines S1i, S2i, and S3i.

In an embodiment, the pixel transistors T1 to T7 and the sensor transistors M1 to M3 may be a P-type transistor (e.g., a PMOS transistor). However, embodiments of the present disclosure are not necessarily limited thereto. For example, at least one of the pixel transistors T1 to T7 and the sensor transistors M1 to M3 may also be implemented as an N-type transistor (e.g., a BIOS transistor). When the pixel transistors T1 to T7 and the sensor transistors M1 to M3 are an N-type transistor, the positions of a source region (e.g., a source electrode) and a drain region (e.g., a drain electrode) may be interchanged.

Figure 6B:
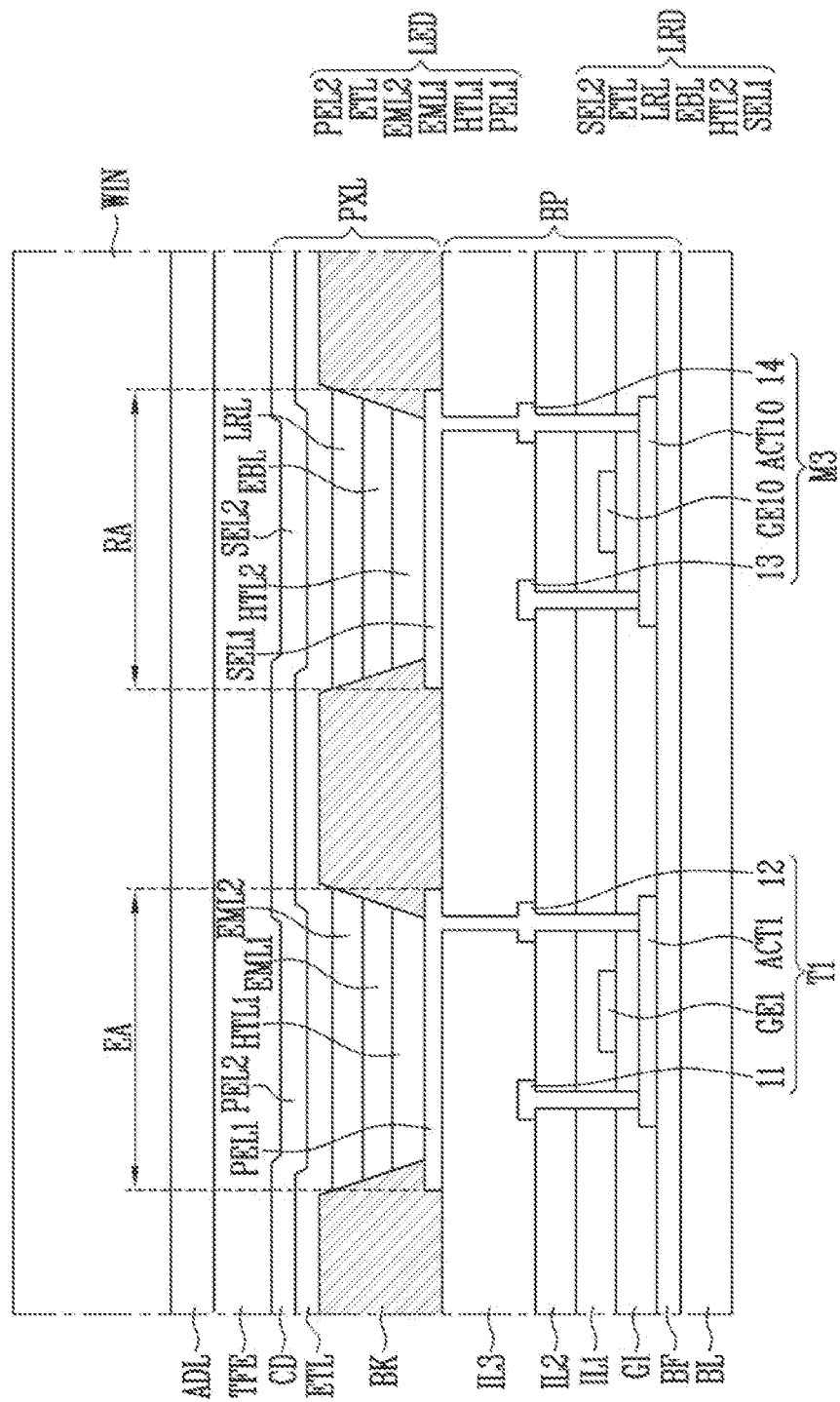

FIG. 6A and FIG. 6B are cross-sectional views of an embodiment of a sensing area of FIG. 4.

Referring to FIGS. 4 to 6A, a foldable display device 1000 (e.g., a display panel 100) may include a base layer BL, a pixel circuit layer BP, a pixel layer PXL, and an encapsulation layer TFE. The foldable display device 1000 may further include an adhesive layer PSA and a window WIN.

A cross-sectional view of FIG. 6A shows some of a pixel PX and an optical sensor PHS. A configuration of a first pixel transistor T1 and a third sensor transistor M3 will be mainly described with reference to FIG. 6A.

In FIG. 6A, for ease of description, the first pixel transistor T1 is directly connected to a light emitting diode (LED). The first pixel transistor T1 may include a first active pattern ACT1, a first gate electrode GE1, a first source electrode 11, and a first drain electrode 12. The third sensor transistor M3 may include a tenth active pattern ACT10, a tenth gate electrode GE10, a tenth source electrode 13, and a tenth drain electrode 14.

In an embodiment, the base layer BL may be made of an insulating material such as glass or a resin. In addition, the base layer BL may be made of a flexible material such that it is bendable or foldable, and may have a single-layer structure or a multi-layer structure.

A pixel circuit layer BP including a pixel circuit PXC and a sensor circuit SSC may be disposed on the base layer BL. The pixel circuit layer BP may include semiconductor layers ACT1 and ACT10, conductive layers GE1, GE10, GE11, GE12, GE13, and GE14, and insulating layers GI, IL1, IL2, and IL3.

A buffer layer BF may be disposed on the base layer BL (e.g., disposed directly thereon). The buffer layer BF may prevent impurities from diffusing into the first pixel transistor T1 and the third sensor transistor M3. However, embodiments of the present disclosure are not necessarily limited thereto. For example, in an embodiment the buffer layer BF may be omitted, such as depending on the material and process condition of the base layer BL.

A semiconductor layer including the first active pattern ACT1 and the tenth active pattern ACT10 is disposed on the buffer layer BF (e.g., disposed directly thereon). In an embodiment, the semiconductor layer may include a poly-silicon semiconductor. For example, the semiconductor layer may be formed by a low-temperature poly-silicon process (e.g., a low-temperature poly-silicon (LTPS) process). However, embodiments of the present disclosure are not necessarily limited thereto and at least some of the semiconductor layer may be formed of an oxide semiconductor or a metal oxide semiconductor.

A gate insulating layer GI may be disposed on the semiconductor layer (e.g., disposed directly thereon). In an embodiment, the gate insulating layer GI may be an inorganic insulating layer that is made of an inorganic material.

A first conductive layer including the first gate electrode GE1 and the tenth gate electrode GE10 may be disposed on the gate insulating layer GI (e.g., disposed directly thereon). The first gate electrode GE1 may cover a region that corresponds to a channel region of the first active pattern ACT1. The tenth gate electrode GE10 may cover a region that corresponds to a channel region of the tenth active pattern ACT10.

In an embodiment, the first conductive layer including the first gate electrode GE1 and the tenth gate electrode GE10 may be made of a metal. For example, the first conductive layer may be made of at least one metal selected from gold (Au), silver (Ag), aluminum (Al), molybdenum (Mo), chromium (Cr), titanium (Ti), nickel (Ni), neodymium (Nd), and copper (Cu), and an alloy thereof. However, embodiments of the present disclosure are not necessarily limited thereto. In addition, the first conductive layer may be formed as a single layer or a multi-layer in which at least two of the metals and the alloys are laminated.

A first insulating layer IL1 (e.g., a first interlayer insulating layer) may be disposed on the first conductive layer (e.g., disposed directly thereon). In an embodiment, the first insulating layer IL1 may be an inorganic insulating layer that is made of an inorganic material. For example, the inorganic material may be a polysiloxane, a silicon nitride, a silicon oxide, or a silicon oxynitride. However, embodiments of the present disclosure are not necessarily limited thereto.

In an embodiment, a second conductive layer may be disposed on the first insulating layer IL1 (e.g., disposed directly thereon). In this embodiment, the second conductive layer may include a readout line RXk, an initialization power line IPL, and a sensing power line PL2. The second conductive layer may be made of at least one metal selected from gold (Au), silver (Ag), aluminum (Al), molybdenum (Mo), chromium (Cr), titanium (Ti), nickel (Ni), neodymium (Nd), and copper (Cu), or an alloy of the metals. However, embodiments of the present disclosure are not necessarily limited thereto. In addition, the second conductive layer may be formed as a single layer, but it is not necessarily limited thereto, and may be formed as a multi-layer in which at least two of the metals and the alloys are laminated.

A second insulating layer IL2 (e.g., a second interlayer insulating layer) may be disposed on the second conductive layer (e.g., disposed directly thereon). In an embodiment, the second insulating layer IL2 may be an inorganic insulating layer that is made of an inorganic material. For example, the inorganic material may be a polysiloxane, a silicon nitride, a silicon oxide, or a silicon oxynitride. However, embodiments of the present disclosure are not necessarily limited thereto.

A third conductive layer including the first source electrode 11, the first drain electrode 12, the tenth source electrode 13, and the tenth drain electrode 14 may be disposed on the second insulating layer IL2 (e.g., disposed directly thereon). Although the first pixel transistor T1 and the third sensor transistor M3 are illustrated in FIG. 6A based on the assumption that they are P-type transistors, the source electrode and the drain electrode may be changed according to the types of transistors.

The first source electrode 11 and the first drain electrode 12 may respectively directly contact the source and drain regions at opposite sides of the first active pattern ACT1, through contact holes that are formed in the gate insulating layer GI, the first insulating layer IL1, and the second insulating layer IL2.

The tenth source electrode 13 and the tenth drain electrode 14 may respectively directly contact the source and drain regions at opposite sides of the tenth active pattern ACT10 through contact holes that are formed in the first insulating layer INS1, the interlayer insulating layer IL, and the gate insulating layer GI.

In an embodiment, the third conductive layer including the first and tenth source electrodes 11 and 13 and the first and tenth drain electrodes 12 and 14 may be made of a metal. For example, the third conductive layer may be made of at least one metal selected from gold (Au), silver (Ag), aluminum (Al), molybdenum (Mo), chromium (Cr), titanium (Ti), nickel (Ni), neodymium (Nd), and copper (Cu), or an alloy thereof. However, embodiments of the present disclosure are not necessarily limited thereto.

In an embodiment, a passivation layer may be disposed on the third conductive layer. In an embodiment, the passivation layer may be an inorganic insulating layer that is made of an inorganic material. For example, the inorganic material may be a polysiloxane, a silicon nitride, a silicon oxide, or a silicon oxynitride. However, embodiments of the present disclosure are not necessarily limited thereto.

The third insulating layer IL3 may be disposed on (e.g., disposed directly thereon) the third conductive layer (e.g., the passivation layer). In an embodiment, the third insulating layer IL3 may be an organic insulating layer that is made of an organic material. For example, the organic insulating material may be a polyacrylate compound, a polyimide-based compound, a fluorine-based carbon compound such as Teflon, or a benzocyclobutene compound. Alternatively, the third insulating layer IL3 may also be an inorganic insulating layer that is made of an inorganic material.

In FIG. 6A, the third insulating layer IL3 is disposed on the second insulating layer IL2. However, embodiments of the present disclosure are not necessarily limited thereto and the insulating layer may be differently arranged. For example, in an embodiment only the passivation layer may be disposed on the source and drain electrodes 11, 12, 13, and 14, and a first pixel electrode PEL1 and a first sensor electrode SEL1 may be disposed on the passivation layer. Alternatively, an additional conductive layer and a fourth insulating layer covering the conductive layer may be disposed on the third insulating layer IL3, and the first pixel electrode PEL1 and the first sensor electrode SEL1 may be disposed on the fourth insulating layer.

The pixel layer PXL may be disposed on the pixel circuit layer BP (e.g., disposed directly thereon). The pixel layer PXL may include a light emitting diode (LED) that is connected to the pixel circuit PXC, and a light receiving element LRD that is connected to the sensor circuit SSC.

In an embodiment, the light emitting diode (LED) may include a first pixel electrode PEL1, a first hole transport layer HTL1, an emission layer EML, an electron transport layer ETL, and a second pixel electrode PEL2. In an embodiment, the light receiving element LRD may include a first sensor electrode SEL1, a second hole transport layer HTL2, an electron blocking layer EBL, a light receiving layer LRL, an electron transport layer ETL, and a second sensor electrode SEL2.

In an embodiment, the first pixel electrode PEL1 and the first sensor electrode SEL1 may be made of a metal layer such as Ag, Mg, Al, Pt, Pd, Au, Ni, Nd, Ir, Cr, and an alloy thereof and/or an indium tin oxide (ITO), an indium zinc oxide (IZO), a zinc oxide (ZnO), and an indium tin zinc oxide (ITZO). However, embodiments of the present disclosure are not necessarily limited thereto. The first pixel electrode PEL1 may connected to the first drain electrode 12 through the contact hole. The first sensor electrode SEL1 may be connected to the tenth drain electrode 14 through the contact hole.

In an embodiment, the first pixel electrode PEL1 and the first sensor electrode SEL1 may be simultaneously formed through patterning using a mask.

A bank layer BK (e.g., a pixel definition layer) that partitions an emission area EA and a light-receiving area RA may be disposed (e.g., disposed directly thereon) on the third insulating layer IL3 on which the first pixel electrode PEL1 and the first sensor electrode SEL1 are disposed. A portion through which light is received by the light receiving element LRD may be defined as the light-receiving area RA.

In an embodiment, the bank layer BK may be an organic insulating layer that is made of an organic material. For example, the organic material may include an acryl resin, an epoxy resin, a phenolic resin, a polyimide resin, and a polyimide resin. However, embodiments of the present disclosure are not necessarily limited thereto.

In addition, the bank layer BK may include a light absorbing material, or may be applied with a light absorbing material to absorb light that is received from the outside. For example, the bank layer BK may include a carbon-based black pigment. However, embodiments of the present disclosure are not necessarily limited thereto, and the bank layer BK may also include chromium (Cr), molybdenum (Mo), an alloy of molybdenum and titanium (MoTi), tungsten (W), vanadium (V), niobium (Nb), tantalum (Ta), manganese (Mn), and cobalt (Co) that have high light absorption, or an opaque metal material such as nickel (Ni).

The bank layer BK exposes a top surface of the first pixel electrode PEL1 and a top surface of the first sensor electrode SEL1, and may protrude from the third insulating layer IL3 along a circumference of the emission area EA and a circumference of the light-receiving area RA. For example, the bank layer BK may include openings that correspond to the emission area EA and the light-receiving area RA. In an embodiment, bank layer BK may directly contact lateral sides of the first pixel electrode PEL1 and the first sensor electrode SEL1 and the openings may expose a central portion of the top surfaces of the first pixel electrode PEL1 and the first sensor electrode SEL1, respectively.

The first hole transport layer HTL1 may be disposed on the top surface of the first pixel electrode PEL1, and the second hole transport layer HTL2 may be disposed on the top surface of the exposed first sensor electrode SEL1. Holes may move to the emission layer EML through the first hole transport layer HTL1, and the holes may move to the light receiving layer LRL through the second hole transport layer HTL2.

In an embodiment, depending on the materials of the emission layer EML and the light receiving layer LRL, the first hole transport layer HTL1 and the second hole transport layer HTL2 may also be the same as or different from each other.

The emission layer EML may be disposed on the first hole transport layer HTL1 in the emission area EA that is surrounded by the bank layer BK. In an embodiment, the emission layer EML may be formed as an organic emission layer. Depending on the organic materials included in the emission layer EML, the emission layer EML may emit light such as red light, green light, or blue light. However, embodiments of the present disclosure are not necessarily limited thereto and the color of the light of the emission layer EML may vary.

In an embodiment as shown in FIG. 6A, the electron blocking layer EBL may be disposed on the second hole transport layer HTL2 in the light-receiving area RA that is surrounded by the bank layer BK. The electron blocking layer EBL may prevent electrons of the light receiving layer LRL from moving to the hole transport layer HTL. In an embodiment, the electron blocking layer EBL may include the same material as that of the first hole transport layer HTL1 of the emission area.

However, embodiments of the present disclosure are not necessarily limited thereto. For example, in an embodiment, the electron blocking layer EBL may be omitted.

The light receiving layer LRL may be disposed on the electron blocking layer EBL or the second hole transport layer HTL2. The light receiving layer LRL may detect the intensity of light by emitting electrons in response to light of a specific wavelength band.

In an embodiment, the light receiving layer LRL may include a low molecular organic material. For example, the light receiving layer LRL may be formed of a phthalocyanine compound that includes one or more metals selected from a group of copper (Cu), iron (Fe), nickel (Ni), cobalt (Co), cobalt (Co), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn). However, embodiments of the present disclosure are not necessarily limited thereto.

Alternatively, the low molecular organic material included in the light receiving layer LRL may be formed as a bi-layer that includes a layer including a phthalocyanine compound including one or more metals selected from a group of copper (Cu), iron (Fe), nickel (Ni), cobalt (Co), cobalt (Co), aluminum (Al), palladium (Pd), tin (Sn), indium (In), lead (Ph), titanium (Ti), rubidium (Rb), vanadium (V), gallium (Ga), terbium (Tb), cerium (Ce), lanthanum (La), and zinc (Zn), and a layer including C60, or may be formed as a mixing layer in which a phthalocyanine compound and C60 are mixed.

However, this is an example, and the light receiving layer LRL may be provided with a polymer organic layer.

In FIG. 6A, for ease of description, the area of the light-receiving area RA is similar to the area of the emission area EA. However, embodiments of the present disclosure are not necessarily limited thereto. For example, in an embodiment the area of the light-receiving area RA may be less than the area of the emission area EA. Accordingly, existence of the light receiving area RA does not significantly affect the emission of the pixel PX for displaying an image, and the foldable display device 1000 may provide a high image quality.

In an embodiment, the electron transport layer ETL may be disposed on the emission layer EML and the light receiving layer LRL. The electron transport layer ETL may be integrally formed on the display area DA. Accordingly, the electron transport layer ETL may directly contact a top surface of the bank layer BK.

However, embodiments of the present disclosure are not necessarily limited thereto, and at least one of the first hole transport layer HTL1, the second hole transport layer the electron blocking layer EBL, and the electron transport layer ETL may be omitted. In addition, functional layers such as a hole injection layer and an electron injection layer may also be added.

The second pixel electrode PEL2 may be disposed on the electron transport layer ETL of the emission area EA, and the second sensor electrode SEL2 may be disposed on the electron transport layer ETL of the light-receiving area RA. In an embodiment, the second pixel electrode PEL2 and the second sensor electrode SEL2 may be a common electrode CD that is integrally formed on the display area DA. A voltage of the second power supply VSS may be supplied to the second pixel electrode PEL2 and the second sensor electrode SEL2.

The second pixel electrode PEL2 and the second sensor electrode SEL2 may be made of a metal layer such as Ag, Mg, Al, Pt, Pd, Au, Ni, Nd, Ir, and Cr, and/or a transparent conductive layer such as ITO, IZO, ZnO, and ITZO. In an embodiment, the common electrode CD may be formed as a multi-layer having two or more layers that includes a thin metal layer, and for example, may be formed as a triple layer of ITO/Ag/ITO.

The encapsulation layer TFE may be disposed on (e.g., disposed directly on) the common electrode CD that includes the second pixel electrode PEL2 and the second sensor electrode SEL2. The encapsulation layer TFE may be formed as a single layer, but may be formed as a multi-layer. In an embodiment shown in FIG. 6A, the encapsulation layer TFE may have a laminated structure in which an inorganic material, an organic material, and an inorganic material are sequentially deposited. A topmost layer of the encapsulation layer TFE may be formed of an inorganic material.

In an embodiment, a window WIN may be disposed on (e.g., disposed directly on) the encapsulation layer TFE. The window WIN serves to cover and protect the structures disposed thereunder. The window WIN may be attached on the encapsulation layer TFE through an adhesive member ADL. For example, in an embodiment the adhesive member ADL may include an Optically Clear Adhesive (OCA), a Super View Resin (SVR), a Pressure Sensitive Adhesive (PSA), or an Optically Clear Resin (OCR).

The window WIN may be made of a transparent material. The window WIN may include plastic, and in this embodiment, the window WIN may have a flexible property. In an embodiment, a thickness of the window WIN may be about 500 μm.

Examples of plastics that the window WIN may be composed of include, but are not necessarily limited to, polyimide, polyacrylate, polymethylmethacrylate, polycarbonate, polyethylenenaphthalate, polyvinylidene chloride, polyvinylidene, polystyrene, an ethylene vinylalcohol copolymer, polyethersulphone, polyetherimide, polyphenylene sulfide, polyallylate, tri-acetyl cellulose, and cellulose acetate propionate. The window WIN may be made of one or more of the plastic materials listed above. However, embodiments of the present disclosure are not necessarily limited thereto.

The embodiment in FIG. 6B is different from the embodiment in FIG. 6A having a single emission layer EML structure in that the light emitting diode (LED) has a structure in which the first emission layer EML1 and the second emission layer EML2 are laminated.

Referring to FIG. 6B, the light emitting diode (LED) may include the first pixel electrode PEL1, the first hole transport layer HTL1, the first emission layer EML1, the second emission layer EML2, the electron transport layer ETL, and the second pixel electrode PEL2. In this embodiment, one of the first emission layer EML1 and the second emission layer EML2 may emit a visible ray, and the other one of the first emission layer EML1 and the second emission layer EML2 may emit an infrared ray.

In an embodiment, the first pixel electrode PEL1 is a reflective anode electrode, the second pixel electrode PEL2 is a transmissive cathode electrode, the first emission layer EML1 emits an infrared ray and the second emission layer EML2 emits a visible ray. However, embodiments of the present disclosure are not necessarily limited thereto.

The first emission layer EML1 may be disposed on (e.g., disposed directly on) the first pixel electrode PEL1 that is exposed by the bank layer. When power is supplied by the first pixel electrode PEL1 and the second pixel electrode PEL2, the first emission layer EML1 may generate light of near-infrared rays. For example, a wavelength range of the light emitted from the first emission layer EML1 may be in a range of about 850 to about 1000 nm. In addition, the first emission layer EML1 may be an organic compound that includes a lanthanide material as shown in Chemical Formula 1 below.

[Chemical Formula 1]

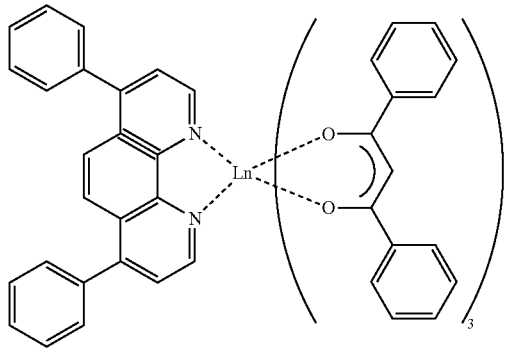

wherein, the Ln may be one element selected from Yb, Nd, and Er.

The second emission layer EML2 may be disposed on the first emission layer EML1. In an embodiment, the color of light generated from second emission layer EML2 may be any one of red, green, blue, and white. For example, a wavelength range of the light emitted from the second emission layer EML2 may be in a range of about 600 nm to about 680 nm. However, embodiments of the present disclosure are not necessarily limited thereto. For example, in an embodiment the color of the light generated from the second emission layer EML2 may be any one of magenta, cyan, and yellow.

As described above, according to the embodiment in FIG. 6B, the light emitting diode (LED) may function as a light source that emits infrared rays.

Figure 7:
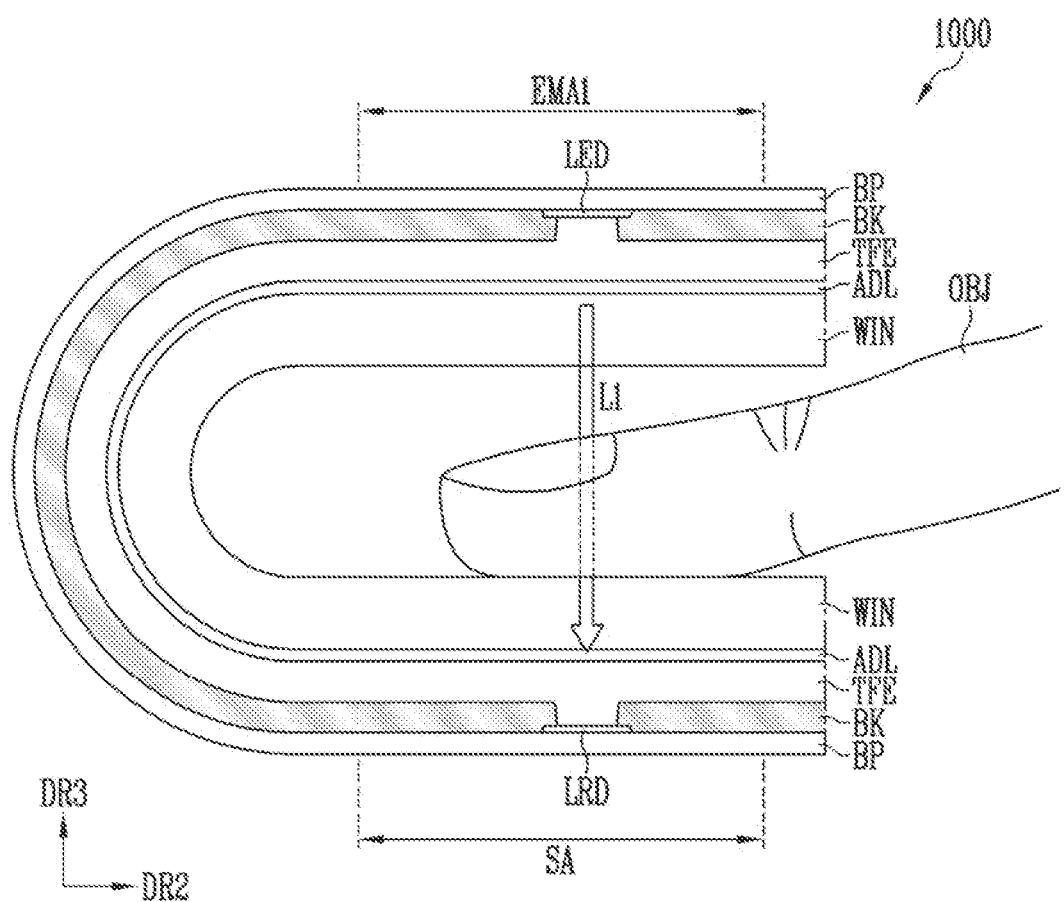
FIGS. 7 and 8 are cross-sectional diagrams for explaining a method of obtaining biometric information of a display device according to embodiments of the present disclosure.
Figure 8:
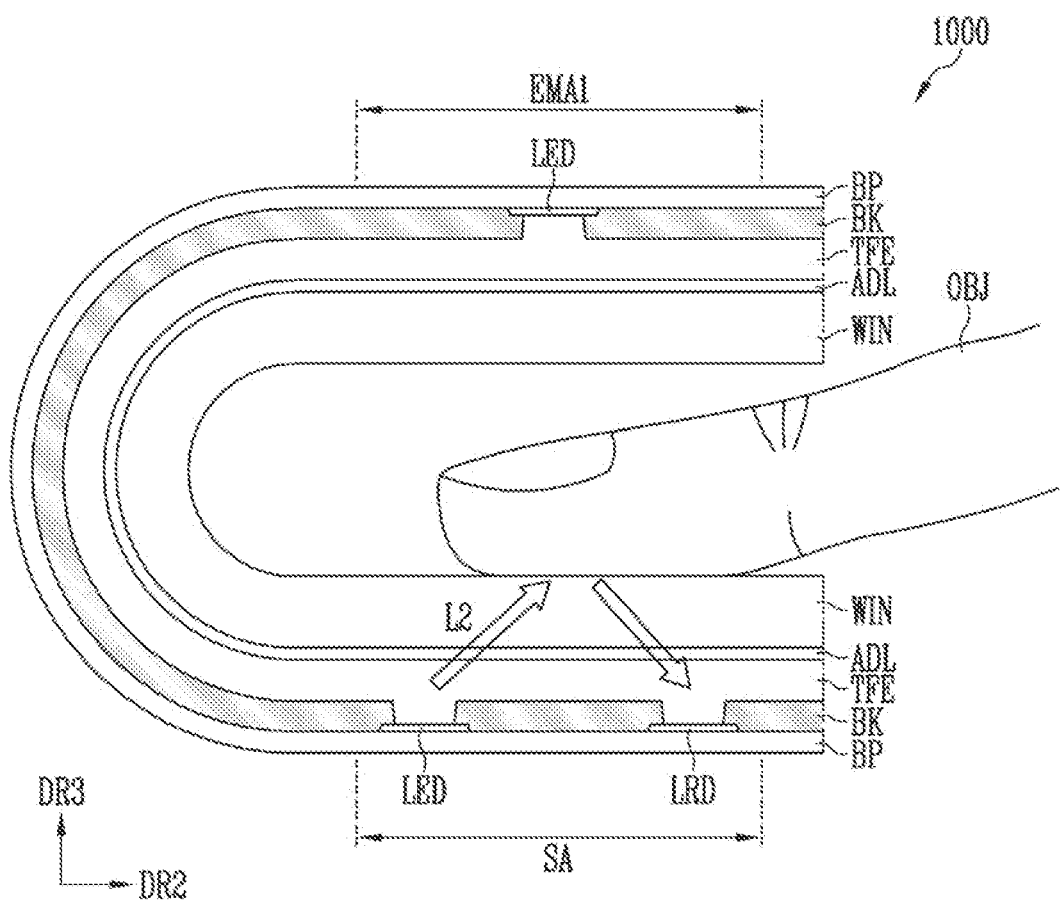

FIGS. 7 and 8 are conceptual diagrams for explaining a method of obtaining biometric information by a display device according to embodiments of the present disclosure. In an embodiment, for convenience of description, only one light receiving element LRD included in the optical sensor PHS is shown at a position corresponding to the sensing area SA in FIG. 4, only one light emitting diode (LED) is shown at a position corresponding to the first emission area EMA1, but it should be understood that a plurality of light emitting diodes (LED) and a plurality of light receiving element LRD may be respectively disposed as an array in the first emission area EMA1 and the sensing area SA.

Referring to FIGS. 4 to 7, when the foldable display device 1000 is folded, the first emission area EMA1 and the sensing area SA included in the display area DA may be disposed to face each other. In an embodiment, the light emitting diode (LED) may be disposed in the first emission area EMA1, and the light receiving element LRD may be disposed in the sensing area SA.

According to an embodiment, when the foldable display device 1000 is folded, an object OBJ may be disposed between the light emitting diode (LED) and the light receiving element LRD in the thickness direction (e.g., the third direction DR3).

In an embodiment, when a request for estimating biometric information is received from a user, a processor 300 may turn on the light emitting diodes (LED) that are disposed in the first emission area EMA1 and may turn off the light emitting diodes (LED) that are disposed in the sensing area SA. However, embodiments of the present disclosure are not necessarily limited thereto, and the light emitting diodes (LED) disposed in the display area DA other than the sensing area SA may be turned on, or the light emitting diodes (LED) disposed in the entire display area DA including the sensing area SA may also be turned on.

In an embodiment, the processor 300 may control the panel driver 210 such that the first emission area EMA1 has a predetermined first luminance value. In this embodiment, the first luminance value is a level sufficient to allow first light L1 emitted from the light emitting diode (LED) to pass through the object OBJ and to be received by the light receiving element LRD.

The panel driver 210 may control the light emitting diode (LED) to emit the first light L1 having the first luminance value. In an embodiment shown in FIG. 6A, the first light L1 may correspond to a visible ray. In an embodiment shown in FIG. 6B, the first light L1 may correspond to an infrared ray.

The light receiving element LRD may receive the first light L1 that passes through the object OBJ. The light receiving element LRD may obtain a biometric signal from the received first light L1, and may transmit the obtained biometric signal to the processor 300. In an embodiment, the biometric signal may be a photoplethysmogram (PPG) signal (hereinafter referred to as a "pulse wave signal"). However, embodiments of the present disclosure are not necessarily limited thereto, and may include various biometric signals that can be modeled by a sum of a plurality of waveform components, such as an electorcardiography (ECG) signal, a photoplethysmogram (PPG) signal, and an electromygraphy (EMG) signal.

In an embodiment, when the biometric signal is received from the light receiving element LRD, the processor 300 may perform preprocessing such as filtering for removing noise, amplification of the biometric signal, and conversion of the biometric signal into a digital signal.

The processor 300 may analyze a waveform of the received biometric signal to extract a feature that is required to estimate biometric data, and may estimate the biometric data by using the extracted feature. In an embodiment, the biometric data includes one or more of oxygen saturation, a pulse, and a blood pressure. However, embodiments of the present disclosure are not necessarily limited thereto.

For example, the amount of change in a mean arterial pressure (MAP) is proportional to a cardiac output (CO) and a total peripheral resistance (TPR) as shown in Equation 1 below.

$$\Delta MAP = CO \times TPR \qquad \text{[Equation 1]}$$

wherein, ΔMAP represents a difference of mean arterial pressures between the left ventricle and the right atrium, and in general, the mean arterial pressure in the right atrium does not exceed 3 to 5 mmHg, such that it has a similar value to the mean arterial pressure in the left ventricle or the mean arterial pressure in the upper arm.

The processor 300 extracts a feature related to a cardiac output (CO) (hereinafter referred to as a 'CO-related feature') and a feature related to a total peripheral resistance (TPR) (hereinafter referred to as a 'TPR-related feature'), and may estimate a blood pressure by using the CO-related feature and the TPR-related feature. Here, the CO-related feature may be a feature value that shows a proportional increase/decrease tendency when the actual total peripheral resistance does not significantly change compared with a steady state but the actual cardiac output relatively increases/decreases. The TPR-related feature may be a feature value that shows a proportional increase/decrease tendency when the actual cardiac output does not significantly change compared with the steady state but the actual total peripheral resistance relatively increases/decreases.

When the CO-related feature and the TPR-related feature are obtained, the processor 300 may estimate the blood pressure by applying a predefined blood pressure estimation model. The blood pressure estimation model may be predefined in the form of a linear or non-linear functional formula that defines a relation between the CO-related and TPR-related features and the blood pressure.

In addition, in an embodiment the processor 300 may obtain a user's blood oxygen saturation patterns from the photoplethysmogram (PPG) signal.

The blood oxygen saturation may mean a ratio of oxygenated hemoglobin (oxygen-containing hemoglobin) to blood hemoglobin (oxygenated hemoglobin and deoxygenated hemoglobin). To obtain the blood oxygen saturation pattern, the processor 300 may emit, through the light emitting diode (LED), light of a first wavelength and light of a second wavelength (e.g. infrared light and red light) that have different light transmittances for the oxygenated hemoglobin and the deoxygenated hemoglobin. The processor 300 may detect the photoplethysmogram (PPG) signal through the light receiving element LRD when multi-wavelength light is emitted.

"Multi-wavelength" (e.g. two or more wavelengths) may be necessary to obtain the blood oxygen saturation pattern. For example, a pair of infrared (e.g., short wavelength) light and red (e.g., long wavelength) light may be used. Alternatively, any other pair of lights (a pair of lights having different wavelengths) may be used.

For example, the oxygenated hemoglobin may absorb more infrared (e.g., shorter wavelength) light, allowing more red light to pass therethrough. The deoxygenated hemoglobin allow more infrared (e.g., shorter wavelength) light to pass therethrough, allowing more red (e.g., longer wavelength) light to be absorbed. The amount of unabsorbed light is measured, and separate normalized signals may be generated for each wavelength. Since the amount of arterial blood present on the object OBJ literally pulses with each heartbeat, the signals for each wavelength may fluctuate with time.

A continuous signal for pulsatile arterial blood may be generated by subtracting minimum transmitted light from the transmitted light of each wavelength. In an embodiment, the continuous signal may be a photoplethysmogram (PPG) signal. A ratio of a measured value of the amount of the red (e.g., longer wavelength) light to a measured value of the amount of the infrared ray (e.g., shorter wavelength) may be calculated form the photoplethysmogram (PPG) signal. The measured value represents a ratio of the oxygenated hemoglobin to the non-oxygenated hemoglobin, and may be expressed in Equation 2.

$$R = \frac{HbO_2}{HbO_2 + Hb} \qquad \text{[Equation 2]}$$

wherein, R may be defined as the ratio, $HbO_2$ may be defined as the oxygenated hemoglobin, and Hb may be defined as the deoxygenated hemoglobin.

The processor 300 may measure blood oxygen saturation based on the ratio calculated by Equation 2. For example, the ratio may be converted into a value of the blood oxygen saturation by using a lookup table based on the Beer-Lambert rule which is the rule that the fraction of absorbed light is proportional to the concentration of a substance.

The embodiment in FIG. 8 is different from the embodiment in FIG. 7, in which a user's biometric information is obtained by using the light emitting diode (LED) included in the first emission area EMA1 and the light receiving element LRD included in the sensing area SA, in that the user's biometric information is obtained by using the light emitting diode (LED) and the light receiving element LRD that are both included in the sensing area SA.

In FIG. 8, the foldable display device 1000 is in a folded state. However, when the user's biometric information is obtained by using the light emitting diode (LED) and the light receiving element LRD that are both included in the sensing area SA, the foldable display device 1000 may also be implemented in an unfolded state. However, when the user's biometric information is obtained when the display device 1000 is folded, noise (e.g., external light) coming from the outside may be blocked to increase a signal-to-noise ratio of the light receiving element LRD.

According to an embodiment, the object OBJ may be disposed on the sensing area SA. For example, the object OBJ may be disposed on the light emitting diode (LED) and the light receiving element LRD that are included in the sensing area SA.

The processor 300 according to an embodiment may detect the biometric signal by using light, which is reflected by the user's object OBJ (e.g., a finger or other body part) to be incident on the light receiving element LRD disposed in the sensing area SA, of second light L2 that is emitted from the light emitting diodes (LED) disposed in the sensing area SA.

In an embodiment, when a request for estimating biometric information is received from the user, the processor 300 may turn on the light emitting diodes (LED) that are disposed in the sensing area SA, and may turn off the light emitting diodes (LED) that are disposed in the display area DA other than sensing area SA. However, embodiments of the present disclosure are not necessarily limited thereto, and the processor 300 may turn on the light emitting diodes (LED) that are disposed in the entire display area DA including the sensing area SA.

The processor 300 according to an embodiment may control the panel driver 210 such that the sensing area SA has a predetermined second luminance value. In this embodiment, the second luminance value is sufficient enough to allow the second light L2 emitted from the light emitting diode (LED) to be reflected by the object OBJ and to be received by the light receiving element LRD. The first luminance value may be greater than the second luminance value.

The panel driver 210 may control the light emitting device LED to emit the second light L2 having the second luminance value. In this embodiment, the second light L2 may correspond to a visible ray in the embodiment illustrated in FIG. 6A, and may correspond to a visible ray and an infrared ray in the embodiment illustrated in FIG. 6B.

Embodiments of the present disclosure will now be described. In the following embodiments, descriptions of the same components as those of embodiments described above will be omitted or simplified, and differences therebetween will be described for convenience of explanation.

Figure 9:
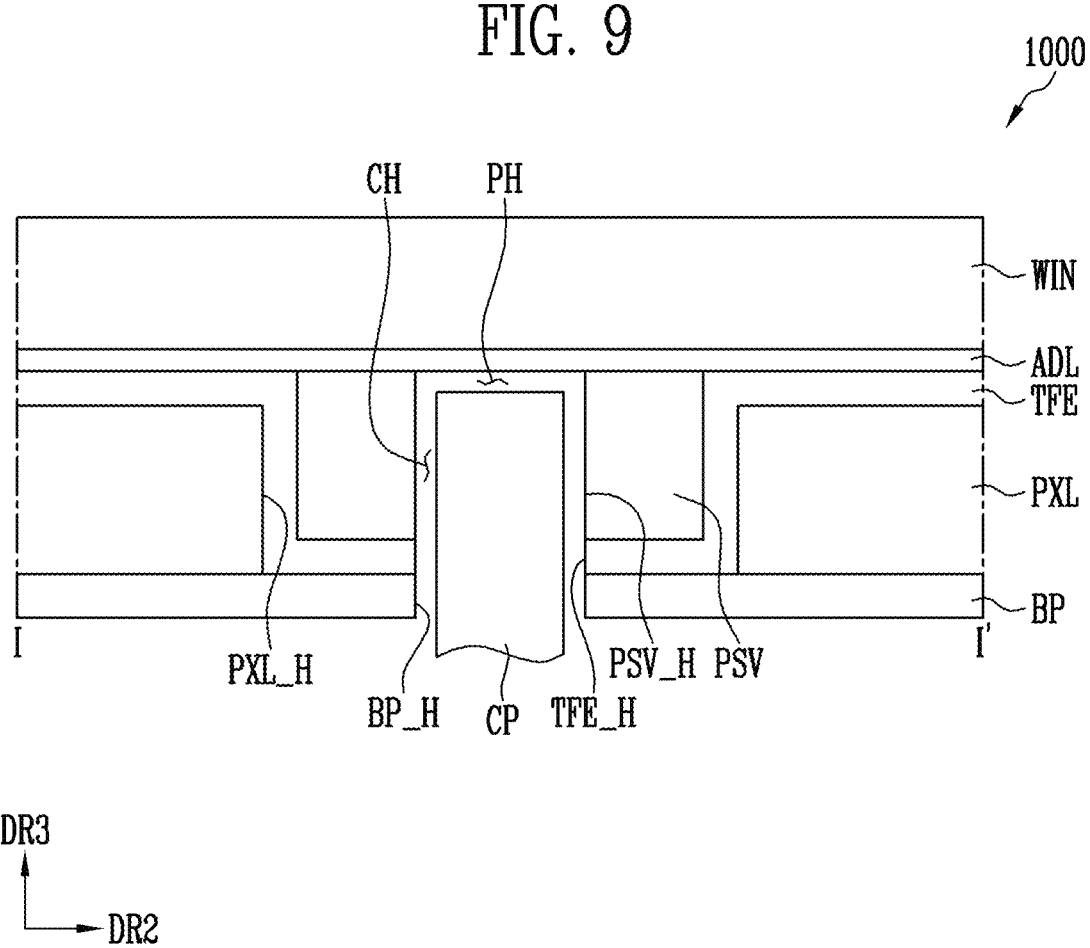
FIG. 9 is a cross-sectional view of a panel hole taken along the line I-I' of FIG. 1 according to an embodiment of the present disclosure.

FIG. 9 is a cross-sectional view of a panel hole in FIG. 1 taken along the line I-I'.

Referring to FIGS. 1, 2 and 9, the foldable display device 1000 may include a pixel circuit layer BP, a pixel layer PXL, an encapsulation layer TFE, an adhesive layer PSA, and a window WIN. In an embodiment, the foldable display device 1000 may include a component CP that corresponds to a panel hole PH and a cover hole CH.

A planarization layer PSV may be disposed in the non-display area around the panel hole PH and the cover hole CH. In an embodiment, the planarization layer PSV includes an organic insulating material. For example, the planarization layer PSV may include a photoresist (e.g., a negative or positive photoresist), the same material as the organic encapsulation layer of the encapsulation layer TFE, or various kinds of organic insulating materials.

As shown in FIG. 9, each of the pixel circuit layer BP, the pixel layer PXL, the encapsulation layer TFE, and the planarization layer PSV may include first to fourth openings BP_H, PXL_H, TFE_H, and PSV_H that correspond to the panel hole PH and the cover hole CH.

The first opening BP_H may be arranged to pass through top and bottom surfaces of the pixel circuit layer BP, the second opening PXL_H may be arranged to penetrate from a lowermost layer to an uppermost layer of the pixel layer PXL, the third opening TFE_H may be arranged to pass through the encapsulation layer TFE, and the fourth opening PSV_H may be arranged to pass through top and bottom surfaces of the planarization layer PSV.

As shown in FIG. 9, the component CP may be disposed inside of the panel hole PH and the cover hole CH of the foldable display device 1000.

The component CP may include an electronic element. For example, the component CP may be an electronic element that uses light. For example, in an embodiment the electronic element may include an infrared sensor, a camera image sensor that receives light to capture an image, and a sensor that outputs and senses light to measure a distance or recognize a fingerprint. The electronic element using light may use light of various wavelength bands, such as visible light, infrared light, and ultraviolet light. In some embodiments, the panel hole PH and the cover hole CH may be a transmission area through which light incident on the component CP from the outside can be transmitted.

Figure 10:
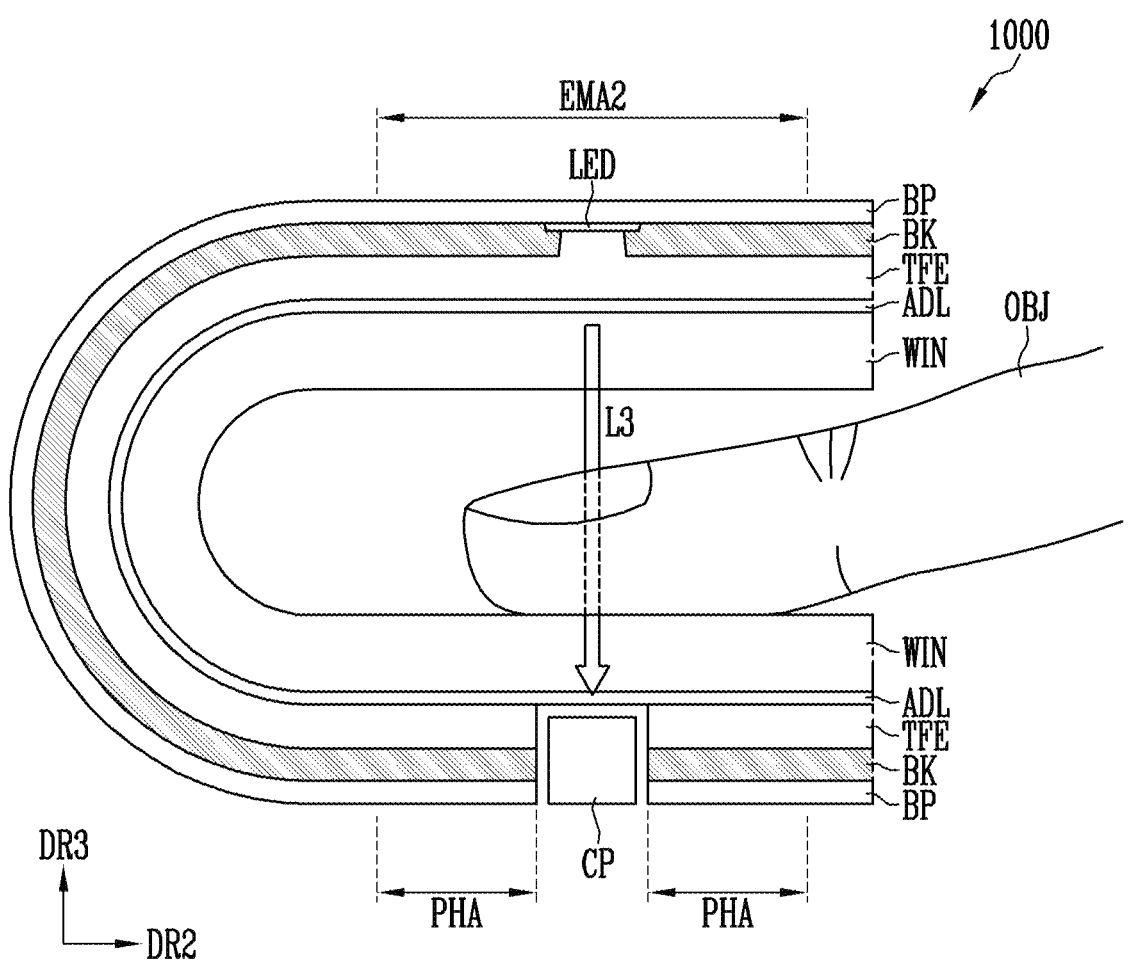
FIGS. 10 and 11 are cross-sectional views for explaining a method of obtaining biometric information by a display device according to embodiments of the present disclosure.
Figure 11:
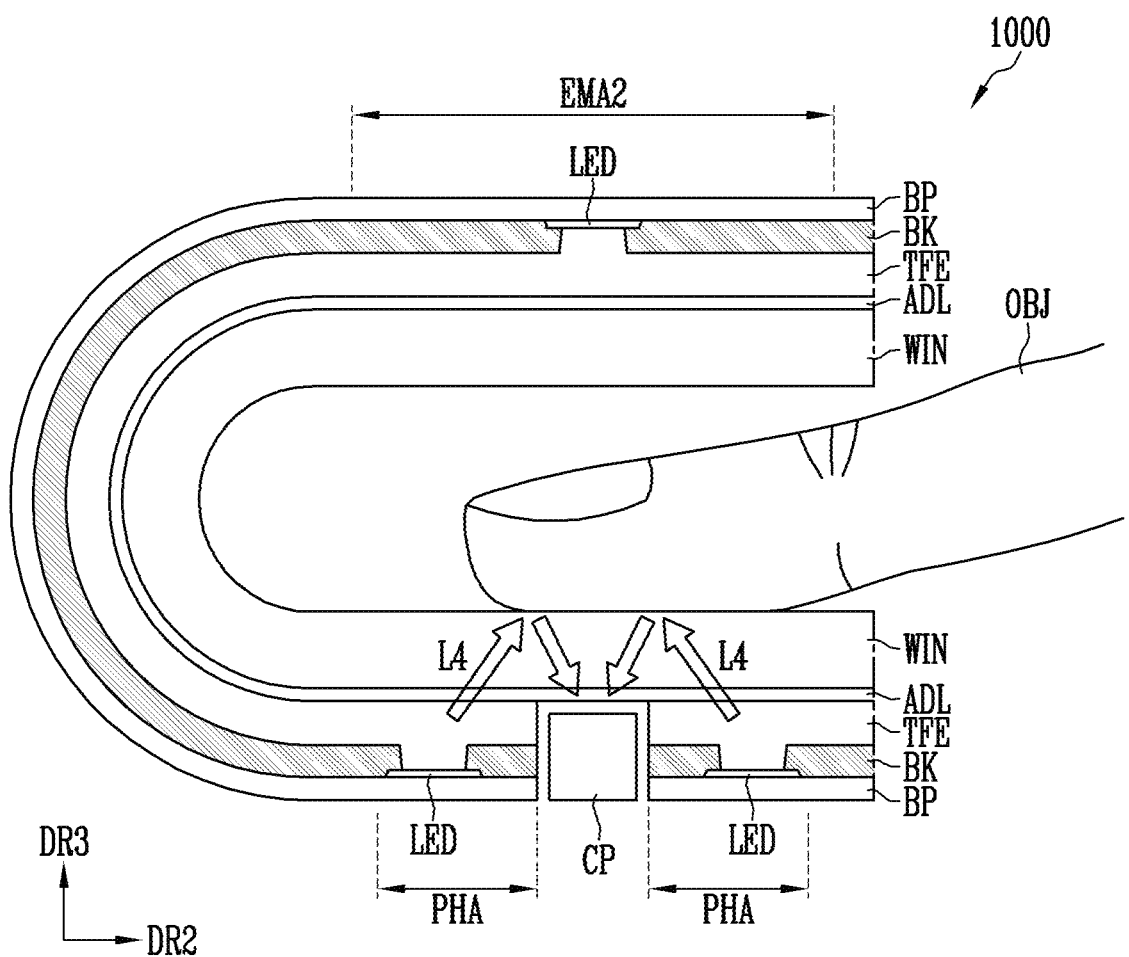

FIGS. 10 and 11 are conceptual diagrams for explaining a method of obtaining biometric information by a display device according to an embodiment. In this embodiment, for ease of description, only one light emitting diode (LED) is illustrated at a position corresponding to the second emission area EMA2 in FIG. 4. However, a plurality of light emitting diodes (LED) may be disposed as an array in the second emission area EMA2.

The embodiments illustrated in FIGS. 10 and 11 are different from the embodiments illustrated in FIGS. 7 and 8 based on the detection of light emitted from the light emitting diode (LED) by using the component CP disposed in the panel hole PH and the cover hole CH instead of the light receiving element LRD disposed in the sensing area SA.

Referring to FIGS. 4 and 10, when the foldable display device 1000 is folded, the second emission area EMA2 and the panel hole PH that are included in the display area DA may be disposed to face each other. In this embodiment, the light emitting diode (LED) may be disposed in the second emission area EMA2, and the component CP may be disposed in the panel hole PR.

According to an embodiment, when the foldable display device 1000 is folded, the object OBJ may be disposed between the light emitting diode (LED) and the component CP in the thickness direction the third direction DR3).

In an embodiment, when a request for estimating biometric information is received from a user, the processor 300 may turn on the light emitting diodes (LED) that are disposed in the second emission area EMA2, and may turn off the light emitting diodes (LED) that are disposed in a peripheral area PHA of the panel hole PH. However, embodiments of the present disclosure are not necessarily limited thereto, and the processor 300 may also turn on the light emitting diodes (LED) that are disposed in the display area DA other than the peripheral area PHA, or may also turn off the light emitting diodes (LED) that are disposed in the entire display area DA including the peripheral area PHA.

The processor 300 according to an embodiment may control the panel driver 210 such that the second emission area EMA2 has a predetermined third luminance value. In this embodiment, the third luminance value is sufficient enough to allow third light L3 emitted from the light emitting diode (LED) to pass through the object OBJ and to be received by the component CP.

The panel driver 210 may control the light emitting diode (LED) to emit the third light L3 having the third luminance value. In this embodiment, the third light L3 may correspond to a visible ray in the embodiment illustrated in FIG. 6A, and may correspond to a visible ray and an infrared ray in the embodiment illustrated in FIG. 6B.

The component CP may receive the third light L3 that passes through the object OBJ. The component CP may obtain a biometric signal from the received third light L3, and may transmit the obtained biometric signal to the processor 300.

In an embodiment, when the biometric signal is received from the component CP, the processor 300 may perform preprocessing such as filtering for removing noise, amplification of the biometric signal, and conversion of the biometric signal into a digital signal.

The processor 300 may analyze a waveform of the received biometric signal to extract a feature that is required to estimate biometric data, and may estimate the biometric data by using the extracted feature.

An embodiment of FIG. 11 is different from an embodiment of FIG. 10 in which a user's biometric information is obtained by using the light emitting diode (LED) included in the second emission area EMA2 and component CP included in the peripheral area PHA, in that the user's biometric information is obtained by using the light emitting diode (LED) disposed in the peripheral area PHA of the panel hole PH and the component CP disposed in the panel hole PH.

In an embodiment as shown in FIG. 11, the foldable display device 1000 is in a folded state. However, embodiments of the present disclosure are not necessarily limited thereto and when the user's biometric information is obtained by using the light emitting diode (LED) and the component CP that are included in the peripheral area PHA of the panel hole, the foldable display device 1000 may also be implemented in an unfolded state. However, in an embodiment in which the user's biometric information is obtained when the foldable display device 1000 is folded, noise (e.g., external light) coming from the outside may be blocked to increase a signal-to-noise ratio of the component CP.

According to an embodiment, the object OBJ may be disposed on the panel hole PH and the peripheral area PHA. For example, the object OBJ may be disposed on the light emitting diode (LED) included in the peripheral area PHA and the component CP disposed in the panel hole PH.

The processor 300 according to an embodiment may detect the biometric signal by using the portion of the fourth light L4 emitted from the light emitting diodes (LED) disposed in the peripheral area PHA which is reflected by the user's object OBJ and is incident on the component CP disposed in the panel hole PH.

In an embodiment, when a request for estimating biometric information is received from the user, the processor 300 may turn on the light emitting diodes (LED) disposed in the peripheral area PHA of the panel hole PH, and may turn off the light emitting diodes (LED) that are disposed in the display area DA other than the peripheral area PHA. However, embodiments of the present disclosure are not necessarily limited thereto. For example, in an embodiment the processor 300 may also turn on the light emitting diodes (LED) that are disposed in the entire display area DA including the peripheral area PHA.

In an embodiment, the processor 300 may control the panel driver 210 such that the peripheral area PHA has a predetermined fourth luminance value. In this embodiment, the fourth luminance value has a level sufficient enough to allow the fourth light L4 emitted from the light emitting diode (LED) to be reflected by the object OBJ and to be received by the component CP. The third luminance value may be greater than the fourth luminance value.

The panel driver 210 may control the light emitting diode (LED) to emit the fourth light L4 having the fourth luminance value. In this embodiment, the fourth light L4 may correspond to a visible ray in the embodiment illustrated in FIG. 6A, and may correspond to a visible ray and an infrared ray in the embodiment illustrated in FIG. 6B.

Figure 12A:
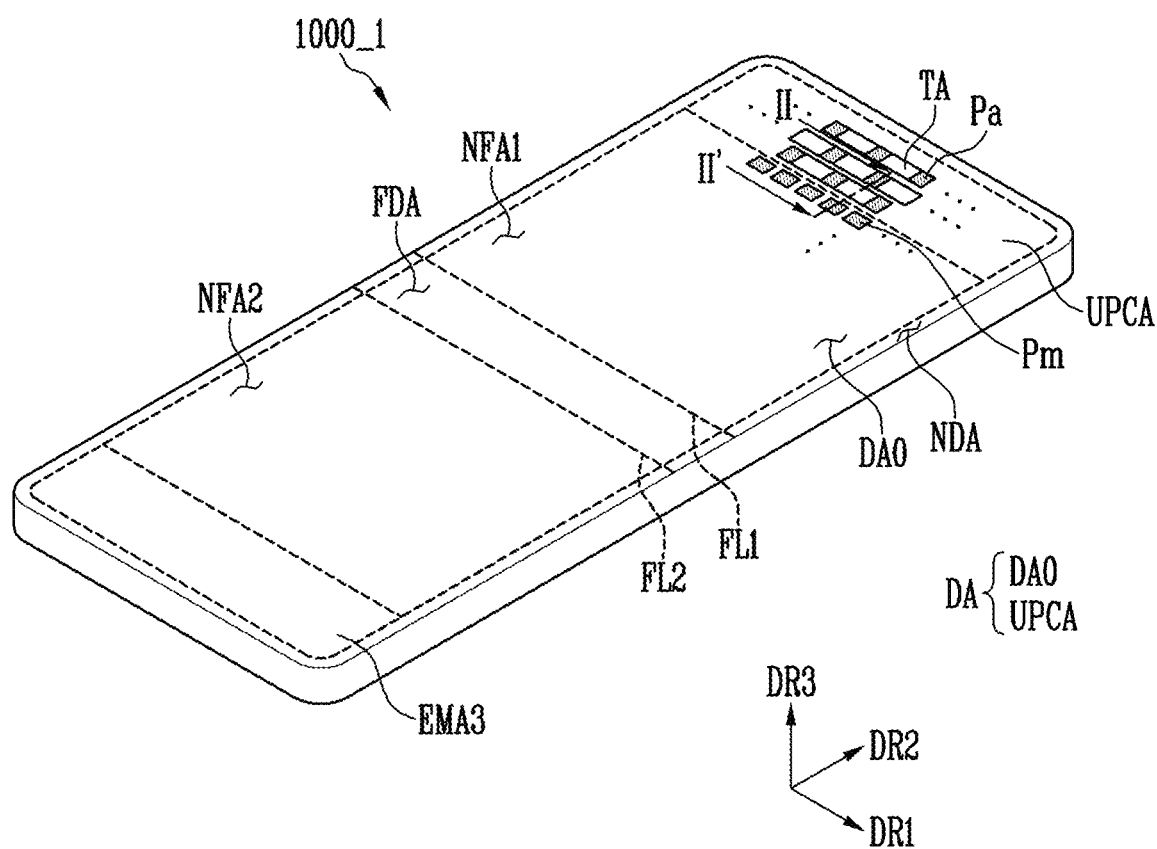
FIG. 12A is a perspective view of a front surface of a foldable display device in an unfolded state according to an embodiment of the present disclosure.
Figure 12B:
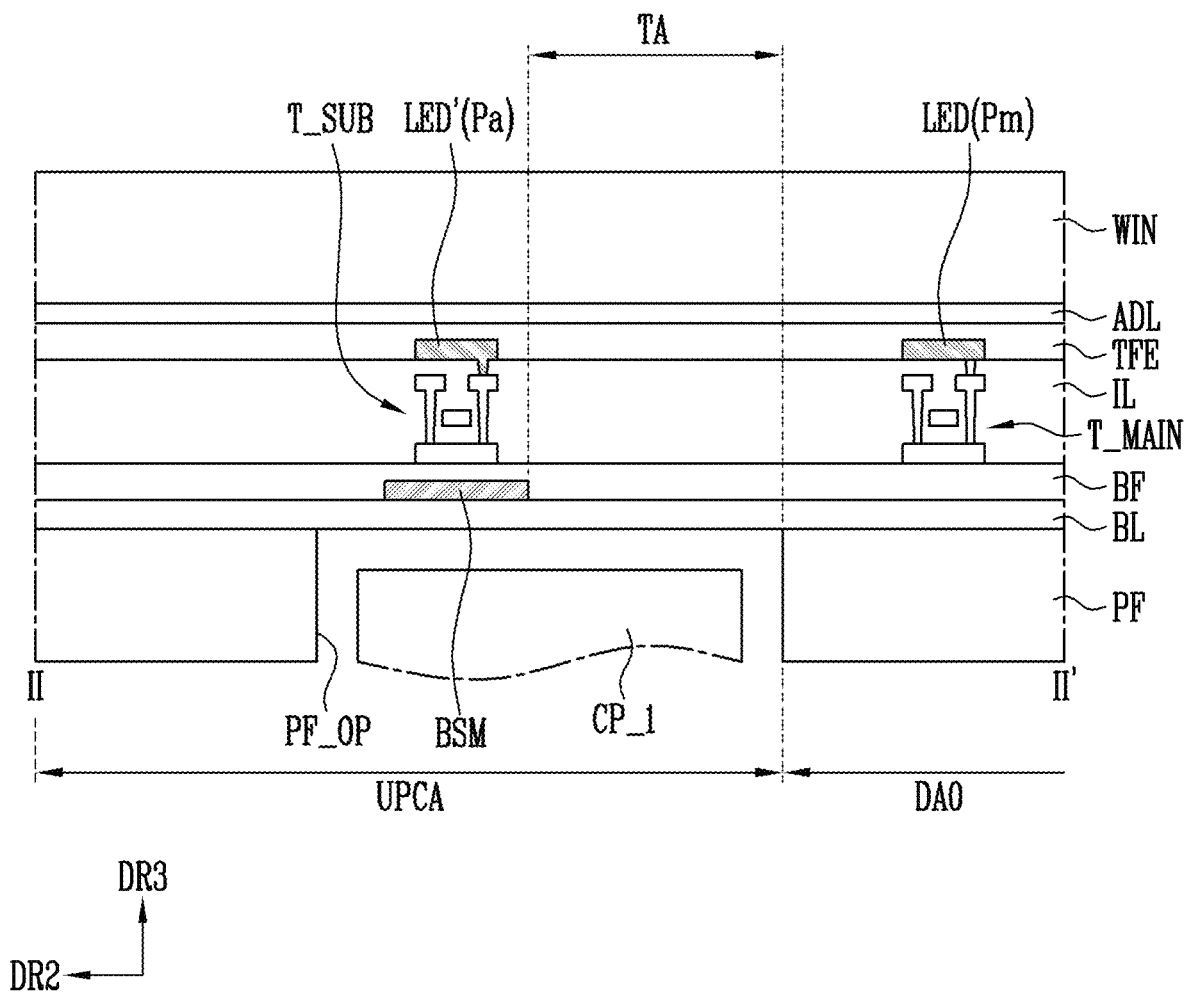
FIG. 12B is a cross-sectional view of a foldable display device taken along the line II-II' of FIG. 12A according to an embodiment of the present disclosure.

FIG. 12A is a perspective view of a front surface of a foldable display device in an unfolded state according to an embodiment of the present disclosure. FIG. 12B is a cross-sectional view of FIG. 12A taken along the line II-II'.

The embodiment illustrated in FIG. 12A is different from the embodiment illustrated in FIG. 1 in that the display area DA includes a sensor area UPCA, and the other components may be substantially the same. The sensor area UPCA will now be described with reference to FIGS. 12A and 12B, and a repeated description of the components will be omitted for convenience of explanation.

The sensor area UPCA may be an area under which a component CP_1 such as a sensor using an infrared ray, visible light, or sound is disposed. The sensor area UPCA may include a transmissive portion TA through which light and/or sound outputted from the component CP_1 to the outside or traveling from the outside to the component CP_1 can pass therethrough.

A plurality of auxiliary pixels Pa may be disposed in the sensor area UPCA, and a predetermined image may be generated by using light that is emitted from the plurality of auxiliary pixels Pa. In an embodiment, as an auxiliary image, the image provided by the sensor area UPCA may have a lower resolution than the resolution provided by a main display area DA0. For example, since the sensor area UPCA includes the transmissive portion TA through which light and/or sound can pass, the number of auxiliary pixels Pa disposed per unit area may be less than the number of main pixels Pm disposed per unit area in the main display area DA0.

In an embodiment as shown in FIG. 12A, the sensor area UPCA may be disposed at one side of the main display area DA0 (e.g., in the second direction DR2) and the sensor area UPCA may be disposed on the main display area DA0.

Referring to FIG. 12B, a display device 1000_1 may include a component CP_1. The component CP_1 may be disposed to correspond to the sensor area UPCA.

In an embodiment, a main pixel Pm including a main pixel transistor T_MAIN and a light emitting diode (LED) connected thereto are disposed in the main display area DA0, and an auxiliary pixel Pa including an auxiliary pixel transistor T_SUB and a light emitting diode (LED') connected thereto may be disposed in the sensor area UPCA. For ease of description in FIG. 12B, the main pixel transistor T_MAIN and the auxiliary pixel transistor T_SUB are both included in the insulating layer IL. However, embodiments of the present disclosure are not necessarily limited thereto and each of the main pixel transistor T_MAIN and the auxiliary pixel transistor T_SUB may correspond to the semiconductor layer ACT1 and the conductive layers GE1, GE11, and GE12 that are shown in FIGS. 6A and 6B, and the insulating layer IL may correspond to the insulating layers GI, IL1, IL2, and IL3 that are shown in FIGS. 6A and 6B.

In addition, the transmissive portion TA in which the auxiliary pixel transistor T_SUB is not disposed may be disposed in the sensor area UPCA. The transmissive portion TA may be understood as a region through which light/signal emitted from the component CP_1 or light/signal incident on the component CP_1 is transmitted.

The component CP_1 may be positioned in the sensor area UPCA. In an embodiment, the component CP_1 may be an electronic element that uses light or sound. For example, the component CP_1 may be a sensor that receives and uses light, such as an infrared sensor, and a sensor that outputs and senses light or sound to measure a distance or recognize a fingerprint, a small lamp that outputs light, and/or a speaker that outputs sound. In an embodiment in which the electronic element uses light, light of various wavelength bands such as visible light, infrared light, and ultraviolet light may be used. A plurality of components CP_1 may be disposed in the sensor area.

A lower metal layer BSM may be disposed in the sensor area UPCA. The lower metal layer BSM may be disposed to correspond to a lower part of the auxiliary pixel transistor T. The lower metal layer BSM may prevent external light from reaching at the auxiliary pixel Pa that is included in the auxiliary pixel transistor T_SUB and the like. For example, the lower metal layer BSM may prevent light emitted from the component CP_1 from reaching at the auxiliary pixel Pa. In an embodiment, the lower metal layer BSM may be disposed on the base layer BL (e.g., disposed directly thereon), and may be covered by the buffer layer BF.

A constant voltage or signal may be applied to the lower metal layer BSM to prevent damage to the pixel circuit due to electrostatic discharge.

A lower protective film PF may be attached under the base layer BL to support and protect the base layer BL. The lower protective film PF may include an opening PF_OP that corresponds to the sensor area UPCA. By providing the lower protective film PF with the opening PF_OP, light transmittance of the sensor area UPCA may be increased. In an embodiment, the lower protective film PF may include polyethyeleneterepthalate (PET) or polyimide (PI).

An area of the sensor area UPCA may be greater than the area in which the component CP_1 is disposed. Accordingly, the area of the opening PF_OP provided in the lower protective film PF may not match the area of the sensor area UPCA. For example, in an embodiment the area of the opening PF_OP may be less than the area of the sensor area UPCA.

In addition, a plurality of components CP_1 may be disposed in the sensor area UPCA. The plurality of components CP_1 may have different functions.

Figure 13:
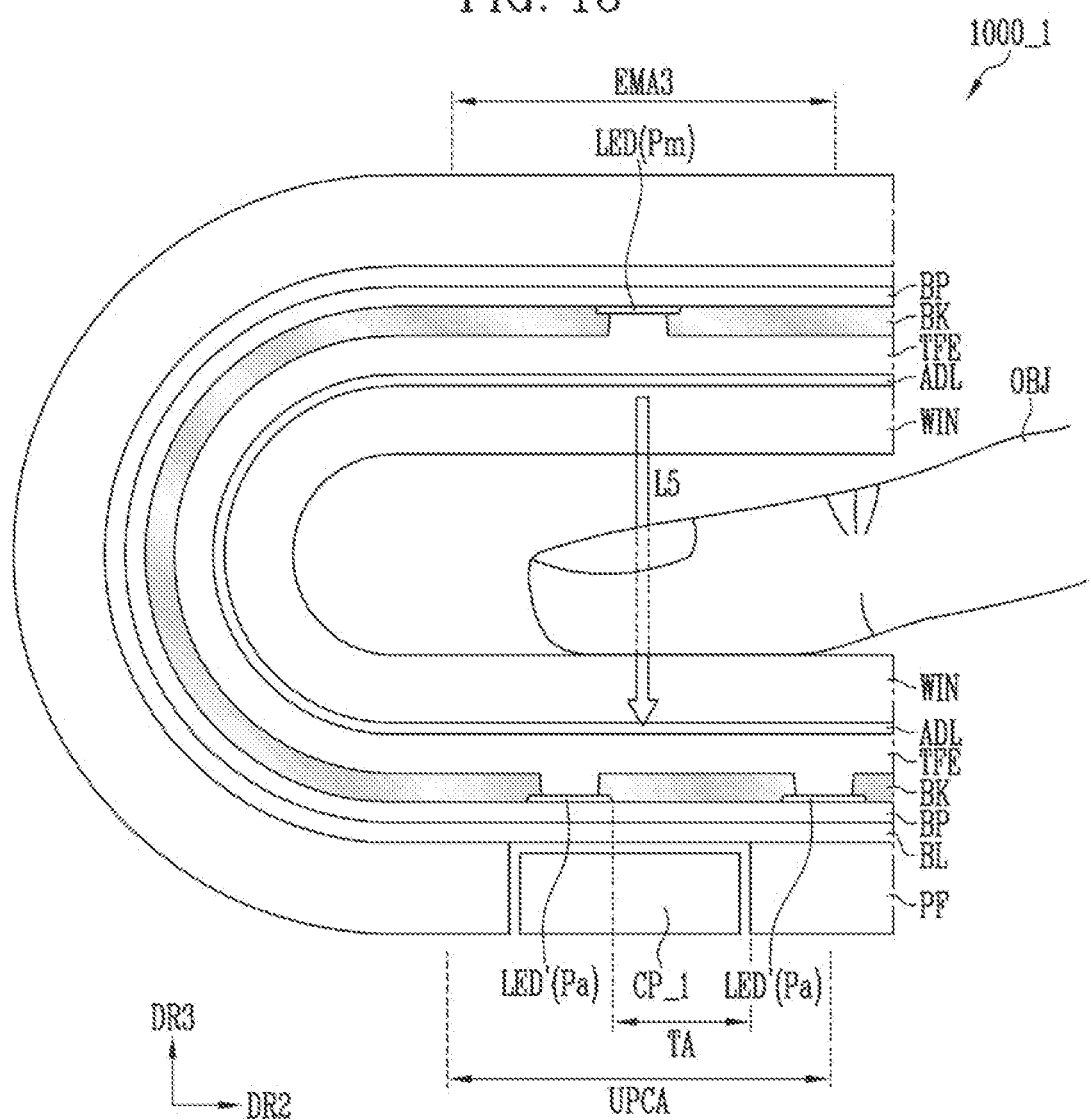
FIGS. 13 and 14 are cross-sectional views for explaining a method of obtaining biometric information by a display device according to an embodiment of the present disclosure.
Figure 14:
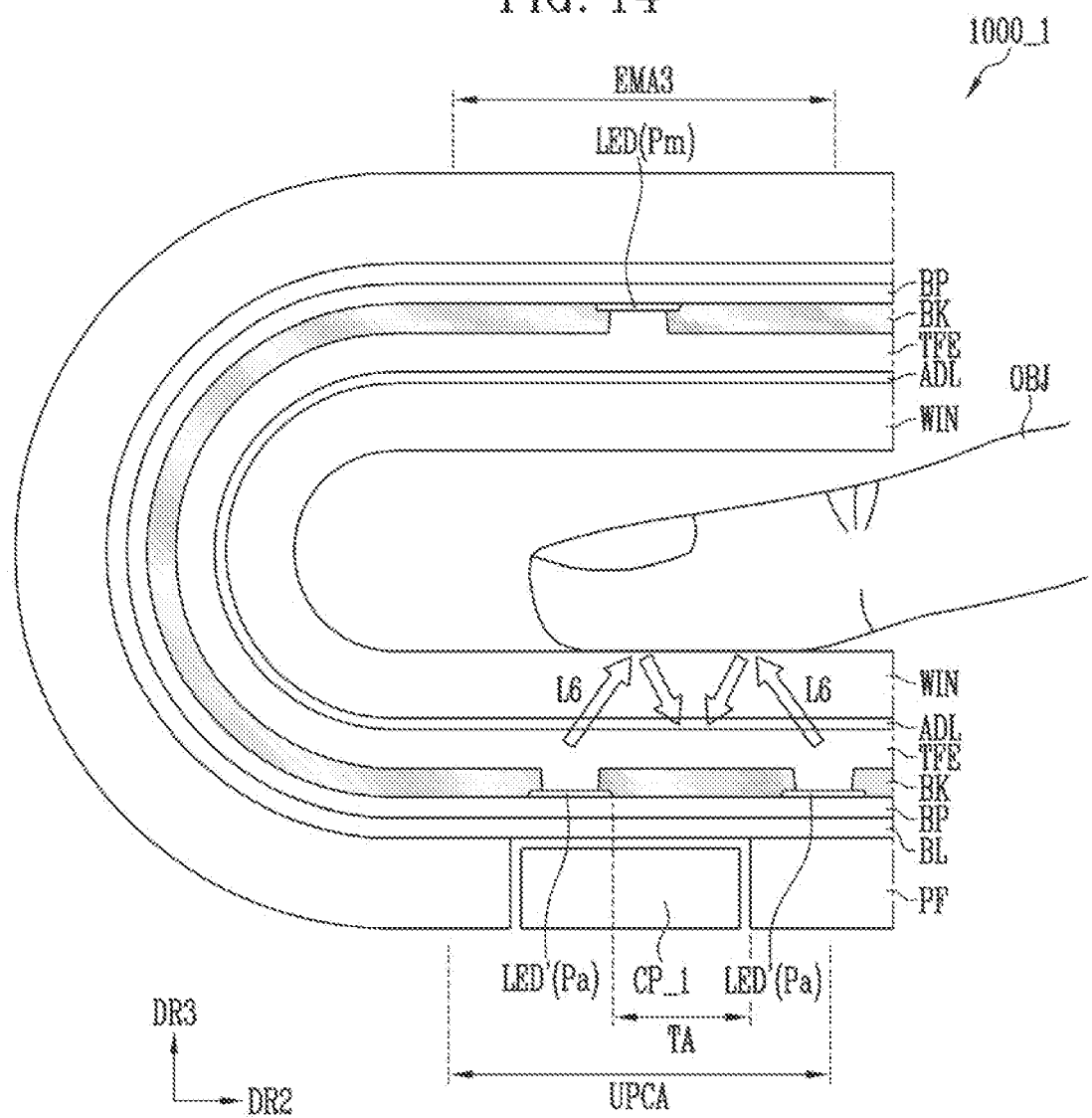

FIGS. 13 and 14 are conceptual diagrams for explaining a method of obtaining biometric information by a display device according to embodiments of the present disclosure. For ease of description, only one light emitting diode (LED) (e.g., a main pixel Pm) is illustrated at a position corresponding to a third emission area EMA3 in FIGS. 13 and 14. However, a plurality of light emitting diodes (LED) may be disposed as an array in the third emission area EMA3.

The embodiments illustrated in FIGS. 13 and 14 are different from the embodiment illustrated in FIG. 7 and in that light emitted from the light emitting diodes LED and LED' is detected by using the component CP_1 disposed in the sensor area UPCA instead of the component CP disposed in the sensing area SA.

Referring to FIGS. 4 and 13, when the display device 1000_1 is folded, the third emission area EMA3 and the sensor area UPCA may be disposed to face each other. In this embodiment, the light emitting diode (LED) (e.g., a main pixel Pm) may be disposed in the third emission area EMA3, and the component CP_1 may be disposed in the sensor area UPCA.

According to an embodiment, when the display device 1000_1 is folded, the object OBJ may be disposed between the light emitting diode (LED) (e.g., a main pixel Pm) and the component CP_1 in the thickness direction (e.g., the third direction DR3).

In an embodiment, when a request for estimating biometric information is received from the user, the processor 300 may turn on the light emitting diodes (LED) (e.g., a main pixel Pm) disposed in the third emission area EMA3, and may turn off the light emitting diodes (LED') (e.g., the auxiliary pixel Pa) disposed in the sensor area UPCA. However, embodiments of the present disclosure are not necessarily limited thereto, and it may also turn on the light emitting diodes (LED') disposed in the sensor area UPCA other than the area overlapping the component CP_1, or may also turn on the light emitting diodes (LED') disposed in the entire sensor area UPCA.

The processor 300 according to an embodiment may control the panel driver 210 such that the third emission area EMA3 has a predetermined fifth luminance value. In this embodiment, the fifth luminance value is sufficient enough to allow fifth light L5 emitted from the light emitting diode (LED) to pass through the object OBJ and to be received by the component CP_1.

The panel driver 210 may control the light emitting diode (LED) to emit the fifth light L5 having the fifth luminance value.

The component CP_1 may receive the fifth light L5 that passes through the object OBJ through the transmissive portion TA. The component CP_1 may obtain a biometric signal from the received fifth light L5, and may transmit the obtained biometric signal to the processor 300.

In an embodiment, when the biometric signal is received from the component CP_1, the processor 300 may perform preprocessing such as filtering for removing noise, amplification of the biometric signal, and conversion of the biometric signal into a digital signal.

The processor 300 may analyze a waveform of the received biometric signal to extract a feature that is required to estimate biometric data, and may estimate the biometric data by using the extracted feature.

An embodiment shown in FIG. 14 is different from the embodiment in FIG. 13 in which a user's biometric information is obtained by using the light emitting diode (LED) (e.g., the main pixel Pm) and the component CP_1 that are included in the third emission area EMA3, in that the user's biometric information is obtained by using the light emitting diode (LED') (e.g., the auxiliary pixel Pa) and the component CP_1 that are disposed in the sensor area UPCA.

In an embodiment shown in FIG. 14, the display device 1000_1 is in a folded state. However, embodiments of the present disclosure are not necessarily limited thereto and when the user's biometric information is obtained by using the light emitting diode (LED') and the component CP_1 that are included in the sensor area UPCA, the display device 1000_1 may also be implemented in an unfolded state. However, if the user's biometric information is obtained when display device 1000_1 is folded, noise (e.g., external light) coming from the outside may be blocked to increase a signal-to-noise ratio of the component CP_1.

According to an embodiment, the object OBJ may be disposed on the sensor area UPCA. For example, the object OBJ may be disposed on the light emitting diode (LED') and the component CP_1 that are included in the sensor area UPCA.

In an embodiment, the processor 300 may detect the biometric signal by using the portion of the sixth light L6 emitted from the light emitting diodes (LED') that is disposed in the sensor area UPCA which is reflected by the user's object OBJ to be incident on the component CP_1 through the transmissive portion TA.

In an embodiment, when a request for estimating biometric information is received from the user, the processor 300 may turn on the light emitting diodes (LED') that are disposed in the sensor area UPCA (e.g., the auxiliary pixel Pa), and may turn off the light emitting diodes (LED) (e.g., the main pixel Pm) that are disposed in the display area DA other than the sensor area UPCA. However, embodiments of the present disclosure are not necessarily limited thereto, and the processor 300 may also turn on the light emitting diodes LED and LED') that are disposed in the entire display area DA including the sensor area UPCA.

In an embodiment, the processor 300 may control the panel driver 210 such that the sensor area UPCA has a predetermined sixth luminance value. In this embodiment, the sixth luminance value has a level that is sufficient to allow the sixth light L6 emitted from the light emitting diode (LED') to be reflected by the object OBJ and to be received by the component CP_1. The fifth luminance value may be greater than the sixth luminance value.

The panel driver 210 may control the light emitting diode (LED') to emit the sixth light L6 having the sixth luminance value.

While the present disclosure has been described in connection with embodiments thereof, it is to be understood that embodiments of the present disclosure are not limited to the described embodiments, but, on the contrary, covers various modifications and equivalent arrangements.

What is claimed is:

1. A display device comprising:
a display panel including a first non-folding area having a first emission area, a second non-folding area having a sensing area and a folding area that is disposed between the first non-folding area and the second non-folding area, wherein a first light emitting diode is disposed in the first emission area and a second light emitting diode and a light receiving element are disposed in the sensing area; and
a processor obtaining a biometric signal of a user by using the light receiving element and at least one of the first light emitting diode and the second light emitting diode, the processor generating biometric information based on the biometric signal, wherein
the processor detects the biometric signal when the display panel is folded so that the first non-folding area and the second non-folding areas are disposed to face each other, and
wherein the first light emitting diode and the light receiving element face each other when the display panel is folded.

2. The display device of claim 1, wherein:
the processor detects the biometric signal by using light from the first light emitting diode that passes through an object of the user that is disposed between the first light emitting diode and the light receiving element.

3. The display device of claim 2, wherein the processor turns off the second light emitting diode when detecting the biometric signal.

4. The display device of claim 1, wherein:
the biometric signal is a photoplethysmogram (PPG) signal; and
the biometric information includes oxygen saturation, pulse, and blood pressure of the user.

5. The display device of claim 1, wherein:
the first light emitting diode and the second light emitting diode include a first emission layer that emits light with a first wavelength range of about 600 to about 680 nm.

6. The display device of claim 5, wherein:
the first light emitting diode and the second light emitting diode further include a second emission layer that emits light with a second wavelength range of about 850 to about 1000 nm.

7. The display device of claim 6, wherein:
the light receiving element includes a light receiving layer that detects intensity of light by emitting electrons in response to the light with the first and second wavelength ranges; and
the light receiving layer is disposed on a same pixel circuit layer as the first emission layer.

8. The display device of claim 1, wherein the processor detects the biometric signal by using light from the second light emitting diode that is reflected by an object of the user that is disposed on the second light emitting diode and the light receiving element.

9. The display device of claim 8, wherein the processor turns off the first light emitting diode when detecting the biometric signal.

10. The display device of claim 8, wherein an intensity of light emitted from the first light emitting diode is greater than an intensity of light emitted from the second light emitting diode.

11. A display device comprising:
a display panel including a first non-folding area having a panel hole and a peripheral area of the panel hole, a second non-folding area having an emission area, and a folding area disposed between the first non-folding area and the second non-folding area, wherein a component is disposed in the panel hole, a first light emitting diode is disposed in the peripheral area of the panel hole and a second light emitting diode is disposed in the emission area; and
a processor obtaining a biometric signal of a user by using the component and at least one of the first light emitting diode and the second light emitting diode, the processor generating biometric information based on the biometric signal, wherein
the processor detects the biometric signal when the display panel is folded so that the first non-folding area and the second non-folding areas are disposed to face each other, and
wherein the second light emitting diode and the component face each other when the display panel is folded.

12. The display device of claim 11, wherein:
the processor detects the biometric signal by using light from the second light emitting diode that passes through an object of the user that is disposed between the second light emitting diode and the component.

13. The display device of claim 12, wherein the processor turns off the first light emitting diode when detecting the biometric signal.

14. The display device of claim 11, wherein:
the biometric signal is a photoplethysmogram (PPG) signal; and
the biometric information includes oxygen saturation, pulse, and blood pressure of the user.

15. The display device of claim 11, wherein:
the first light emitting diode and the second light emitting diode include a first emission layer that emits light with a first wavelength range of about 600 to about 680 nm.

16. The display device of claim 15, wherein:
the first light emitting diode and the second light emitting diode further include a second emission layer that emits light with a second wavelength range of about 850 to about 1000 nm.

17. The display device of claim 11, wherein the component includes a camera image sensor and an infrared sensor.

18. The display device of claim 11, wherein the processor detects the biometric signal by using light from the first light emitting diode that is reflected by an object of the user that is disposed on the first light emitting diode and the component.

19. The display device of claim 18, wherein the processor turns off the second light emitting diode when detecting the biometric signal.

20. The display device of claim 18, wherein an intensity of light emitted from the second light emitting diode is greater than an intensity of light emitted from the first light emitting diode.

* * * * *